US008957566B2

(12) United States Patent
Tabata et al.

(10) Patent No.: US 8,957,566 B2
(45) Date of Patent: Feb. 17, 2015

(54) POWER GENERATION UNIT, ELECTRONIC APPARATUS, TRANSPORTATION DEVICE, BATTERY, AND METHOD OF CONTROLLING POWER GENERATION UNIT

(71) Applicant: Seiko Epson Corporation, Tokyo (JP)

(72) Inventors: Kunio Tabata, Shiojiri (JP); Atsushi Oshima, Shiojiri (JP); Hiroyuki Yoshino, Suwa (JP); Noritaka Ide, Shiojiri (JP); Yasuhiro Ono, Matsumoto (JP); Atsuya Hirabayashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 329 days.

(21) Appl. No.: 13/633,195

(22) Filed: Oct. 2, 2012

(65) Prior Publication Data

US 2013/0082571 A1    Apr. 4, 2013

(30) Foreign Application Priority Data

Oct. 3, 2011  (JP) ................................. 2011-219334
Jun. 27, 2012  (JP) ................................. 2012-144446

(51) Int. Cl.
*H02N 2/18* (2006.01)
*H01L 41/113* (2006.01)

(52) U.S. Cl.
CPC ............ *H01L 41/1136* (2013.01); *H02N 2/181* (2013.01); *H02N 2/188* (2013.01)
USPC ............ 310/319; 310/318; 310/339; 310/364

(58) Field of Classification Search
CPC ... H01L 41/044; H01L 41/107; H01L 41/042; H01L 41/1132; H01L 41/1136; H05B 41/2822; G01L 1/16; H02N 2/18; F23Q 3/002

USPC .................................. 310/318, 319, 339, 364
See application file for complete search history.

(56) References Cited

U.S. PATENT DOCUMENTS 5,552,656 A    9/1996  Taylor
5,675,296 A *  10/1997  Tomikawa ..................... 331/158

(Continued)

FOREIGN PATENT DOCUMENTS

JP        07-107752 A    4/1995
JP     2003-218418 A    7/2003

(Continued)

OTHER PUBLICATIONS

E. Lefeuvre et al., "A comparison between several vibration-powered piezoelectric generators for standalone systems", Sensors and Actuators A: Physical, vol. 126, Issue 2, Feb. 14, 2006, pp. 405-416.

*Primary Examiner* — Derek Rosenau
*Assistant Examiner* — Bryan Gordon
(74) *Attorney, Agent, or Firm* — Maschoff Brennan

(57) ABSTRACT

A power generation unit includes a first piezoelectric device having a pair of electrodes, a second piezoelectric device stacked on the first piezoelectric device, a switch electrically connected between the pair of electrodes, a current detection section adapted to detect a current generated in the second piezoelectric device, and a control section adapted to control the switch, and the control section electrically connects the switch for a predetermined period in at least either one of a case in which the current detected by the current detection section reaches a level one of equal to and higher than a first reference value or a case in which the current reaches a level one of equal to and lower than a second reference value.

18 Claims, 15 Drawing Sheets

(56) References Cited

U.S. PATENT DOCUMENTS

| | | | |
|---|---|---|---|
| 5,801,475 A | 9/1998 | Kimura | |
| 6,252,336 B1* | 6/2001 | Hall | 310/339 |
| 6,522,048 B1* | 2/2003 | Burns et al. | 310/316.01 |
| 8,026,650 B2* | 9/2011 | Ramadass et al. | 310/318 |
| 8,368,290 B2 | 2/2013 | Kwon et al. | |
| 8,373,332 B2 | 2/2013 | Lee | |
| 2002/0149296 A1* | 10/2002 | Fujii et al. | 310/328 |
| 2010/0102782 A1 | 4/2010 | Thiesen et al. | |
| 2012/0119618 A1 | 5/2012 | Tabata et al. | |
| 2012/0126666 A1* | 5/2012 | Tabata et al. | 310/319 |
| 2012/0212101 A1 | 8/2012 | Tabata et al. | |
| 2013/0082569 A1 | 4/2013 | Hirabayashi et al. | |

FOREIGN PATENT DOCUMENTS

| | | |
|---|---|---|
| JP | 2005-312269 A | 11/2005 |
| JP | 4811537 B1 | 9/2011 |
| JP | 4835888 B1 | 12/2011 |
| JP | 4835889 B1 | 12/2011 |

* cited by examiner

DIRECTION OF DEFORMATION

DOWNWARD MAXIMUM DISPLACEMENT

DOWNWARD MAXIMUM DISPLACEMENT

DOWNWARD MAXIMUM DISPLACEMENT

DOWNWARD MAXIMUM DISPLACEMENT

DOWNWARD MAXIMUM DISPLACEMENT

POWER GENERATION UNIT, ELECTRONIC APPARATUS, TRANSPORTATION DEVICE, BATTERY, AND METHOD OF CONTROLLING POWER GENERATION UNIT

BACKGROUND

1. Technical Field

The present invention relates to a power generation unit, an electronic apparatus, a transportation device, a battery, and a method of controlling the power generation unit.

2. Related Art

When a piezoelectric material such as lead zirconium titanate (PZT), quartz crystal ($SiO_2$), or zinc oxide (ZnO) is deformed in response to an external force, electrical polarization is induced inside the material, and positive and negative charges appear on the surface. Such a phenomenon is called a so-called piezoelectric effect. There has been proposed an electrical power generation method of vibrating a cantilever to thereby make a weight repeatedly act on the piezoelectric material, and thus taking out the charge generated on the surface of the piezoelectric material as electricity using such a characteristic provided to the piezoelectric material. For example, by vibrating a metal cantilever having a mass disposed at the tip and a thin plate made of the piezoelectric material bonded thereto, and taking out the positive and negative charges generated on the piezoelectric material due to the vibration, an alternating current is generated. Then, the alternating current is rectified by diodes, and then stored in a capacitor, and then taken out as electricity. Such a technology has been proposed in JP-A-7-107752.

In the power generation unit using such technologies, when a force stronger than the assumed force is applied to the cantilever to thereby excessively swing the cantilever, the cantilever might collide with a peripheral member to thereby be damaged. In order to prevent the above, there has been proposed a technology of providing an elastic body to an inside wall of a housing for housing the cantilever to thereby absorb the impact caused when the cantilever collides with the inside wall of the housing (JP-A-2003-218418).

However, in the technology of the related art proposed in the document, since it is required to prepare a space for disposing the elastic body, there is a problem that it is difficult to sufficiently miniaturizing the power generation unit.

SUMMARY

An advantage of some aspects of the invention is to provide a technology capable of preferably miniaturizing the power generation unit incorporating the deforming member by suppressing the excessive swing of the deforming member.

Application Example 1

A power generation unit according to the present application example of the invention includes a first piezoelectric device having a pair of electrodes, a second piezoelectric device stacked on the first piezoelectric device, a switch electrically connected between the pair of electrodes, a current detection section adapted to detect a current generated in the second piezoelectric device, and a control section adapted to control the switch, and the control section electrically connects the switch for a predetermined period in at least either one of a case in which the current detected by the current detection section reaches a level one of equal to and higher than a first reference value or a case in which the current reaches a level one of equal to and lower than a second reference value.

In the power generation unit according to the present application example, by deforming the first piezoelectric device, positive and negative charges are generated in the first piezoelectric device due to the piezoelectric effect. If the first piezoelectric device is deformed repeatedly, the positive and negative charges are also generated repeatedly, and by taking out the charges as a current, the power generation is performed. Further, since the second piezoelectric device stacked on the first piezoelectric device is provided, the second piezoelectric device is also deformed in conjunction with the deformation of the first piezoelectric device. Therefore, the current corresponding to the deformation amount of the first piezoelectric device is generated in the second piezoelectric device. Therefore, it is possible to detect the deformation amount of the first piezoelectric device based on the current generated in the second piezoelectric device. Further, the switch is electrically connected for the predetermined period to thereby set between the pair of electrodes provided to the first piezoelectric device to a shorted state in at least either one of the case in which the current generated in the second piezoelectric device reaches a level equal to or higher than the first reference value or the case in which the current reaches a level equal to or lower than the second reference value. In other words, when the deformation amount of the first piezoelectric device reaches a level equal to or higher than a predetermined value, between the pair of electrodes provided to the first piezoelectric device are set to the shorted state. Since the piezoelectric device has a property of hardly deforming in the state of shorting between the pair of electrodes, according to the operation described above, the deformation of the first piezoelectric device can be reduced. Therefore, it is not required to provide the member for absorbing the impact at the time of the collision, and thus, it becomes possible to miniaturize the power generation unit. Further, since the second piezoelectric device can be formed in the similar process to the process for forming the first piezoelectric device, it becomes possible to improve the productivity.

Application Example 2

In the power generation unit according to the above application example, it is preferable that the power generation unit further includes an inductor connected in series to the switch, the inductor and the first piezoelectric device constitute a resonant circuit, and in a period other than the predetermined period, the control section electrically connects the switch at a timing at which a deformation direction of the first piezoelectric device is switched, and then the control section electrically disconnects the switch at a timing at which a predetermined time has elapsed.

The generation amount of the charge of the first piezoelectric device and the second piezoelectric device increases as the deformation amount of the piezoelectric devices increases. Further, the first piezoelectric device constitutes the resonant circuit together with the inductor, and the resonant circuit is provided with a switch. Further, the deformation of the deforming member is started in the state in which the switch is electrically disconnected, and then the switch is electrically connected (is set to the conduction state) when the deformation amount reaches an extreme value (i.e., the deformation direction is switched). Since the first piezoelectric device generates more charge as the deformation amount increases, when the charge generated in the first piezoelectric device reaches the maximum value, the first piezoelectric device is connected to the inductor to thereby form the resonant circuit. Then, the charges generated in the first piezoelectric device flows into the inductor. Then, since the first piezoelectric device and the inductor constitute the resonant circuit, the current having flown into the inductor overshoots, and then flows into the terminal on the opposite side of the first piezoelectric device. This period (i.e., the period until the charge flown out from one terminal of the first piezoelectric device flows again into the first piezoelectric device through the other terminal via the inductor) is a half of the resonance period of the resonant circuit composed of the first piezoelectric device and the inductor. Therefore, by forming the resonant circuit by setting the switch to the connected state when the deformation direction of the first piezoelectric device is switched, and then setting the switch to the disconnected state when the time period half as long as the resonance period has elapsed, it is possible to reverse the locations of the positive and negative charges having been generated in the first piezoelectric device before connecting the inductor. Then, by deforming the first piezoelectric device in turn in the opposite direction from that state, the charges are accumulated in the first piezoelectric device in such a manner that the new charges further generated by the piezoelectric effect in the state in which the locations of the positive and negative charges are reversed are stacked incrementally thereon. Further, since the voltage generated also increases as the charges are stored in the first piezoelectric device, it is possible to generate a voltage higher than the voltage generated by the electrical polarization of the piezoelectric material forming the first piezoelectric device without additionally preparing a step-up circuit.

Application Example 3

In the power generation unit according to the above application example, it is preferable that the control section electrically connects the switch at a timing at which the deformation direction of the first piezoelectric device is switched based on the current detected by the current detection section.

Since the first piezoelectric device and the second piezoelectric device are stacked each other, if the deformation direction of the first piezoelectric device is switched, the deformation direction of the second piezoelectric device is also switched. Further, the timing at which the deformation direction of the second piezoelectric device is switched coincides with the timing (the timing at which the current vanishes) at which the direction of the current due to the charge generated by the second piezoelectric device is switched. Therefore, by detecting the current generated in the second piezoelectric device, the switch can easily be set to the conduction state at the timing at which the deformation direction of the first piezoelectric device is switched. Further, by electrically connecting the switch (setting the switch to the conduction state) for a predetermined time from the switching of the deformation direction of the first piezoelectric device, it becomes for the control section to efficiently accumulate the charge in the first piezoelectric device. Therefore, it is possible to realize the small-sized power generation unit capable of efficiently generating a high voltage using the piezoelectric effect.

Application Example 4

In the power generation unit according to the above application example, it is preferable that the current detection section includes a capacitor connected in parallel to the second piezoelectric device, and a current detect circuit adapted to detect a current flowing in the capacitor.

Since the capacitor is connected in parallel to the second piezoelectric device, the current having the same phase as that of the current generated in the second piezoelectric device flows in the capacitor. Therefore, by detecting the current flowing in the capacitor, the timing (the timing at which the current vanishes) at which the direction of the current due to the charge generated in the second piezoelectric device is switched can easily be detected.

Application Example 5

In the power generation unit according to the above application example, it is preferable that the power generation unit further includes a deforming member adapted to deform while switching a deformation direction, and the first piezoelectric device and the second piezoelectric device are laminated sandwiching the deforming member.

By stacking the first piezoelectric device and the second piezoelectric device with the deforming member sandwiched therebetween, the first piezoelectric device and the second piezoelectric device can easily be formed on both of the surfaces of the deforming member using a manufacturing method such as a thin-film method.

Application Example 6

An electronic apparatus according to the present application example includes the power generation unit according to any one of the application examples described above.

Application Example 7

A transportation device according to the present application example includes the power generation unit according to any one of the application examples described above.

Application Example 8

A battery according to the present application example includes the power generation unit according to any one of the application examples described above.

According to these application examples, since it is possible to incorporate the power generation unit in the battery, or to incorporate the power generation unit in the electronic apparatus such as a remote controller instead of the battery or as an aid to the battery, the electrical power can be generated due to the transportation of the electrical apparatus. Further, for example, by applying the power generation unit according to the application example of the invention to the transportation device such as a vehicle or an electric train, it is also possible to generate power by the vibration due to the transportation, and to supply the electrical power efficiently to the equipment provided to the transportation device.

Application Example 9

A method of controlling a power generation unit according to the present application example of the invention includes providing a first piezoelectric device having a pair of electrodes, a second piezoelectric device stacked on the first piezoelectric device, and a switch electrically connected between the pair of electrodes, detecting a current generated in the second piezoelectric device, and connecting electrically the switch for a predetermined period in at least either one of a case in which the current detected in the detecting reaches a level one of equal to and higher than a first reference value or a case in which the current reaches a level one of equal to and lower than a second reference value.

According to the present application example, the switch is electrically connected for the predetermined period to thereby set the pair of electrodes provided to the first piezoelectric device to a shorted state in at least either one of the case in which the current generated in the second piezoelectric device reaches a level equal to or higher than the first reference value or the case in which the current reaches a level equal to or lower than the second reference value. In other words, when the deformation amount of the first piezoelectric device reaches a level equal to or higher than a predetermined value, the pair of electrodes provided to the first piezoelectric device are set to the shorted state. Since the piezoelectric device has a property of hardly deforming in the state of shorting the pair of electrodes, according to the operation described above, the deformation of the first piezoelectric device can be reduced. Since the first piezoelectric device can also be inhibited from being excessively deformed, it is not required to provide a member for absorbing the impact at the time of collision, and it becomes possible to miniaturize the power generation unit.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Hereinafter, a preferred embodiment of the invention will be described in detail with reference to the accompanying drawings. The drawings used therein are for the sake of convenience of explanation. It should be noted that the embodiment described below does not unreasonably limit the contents of the invention as set forth in the appended claims. Further, all of the constituents described below are not necessarily essential elements of the invention.

Figure 1A:
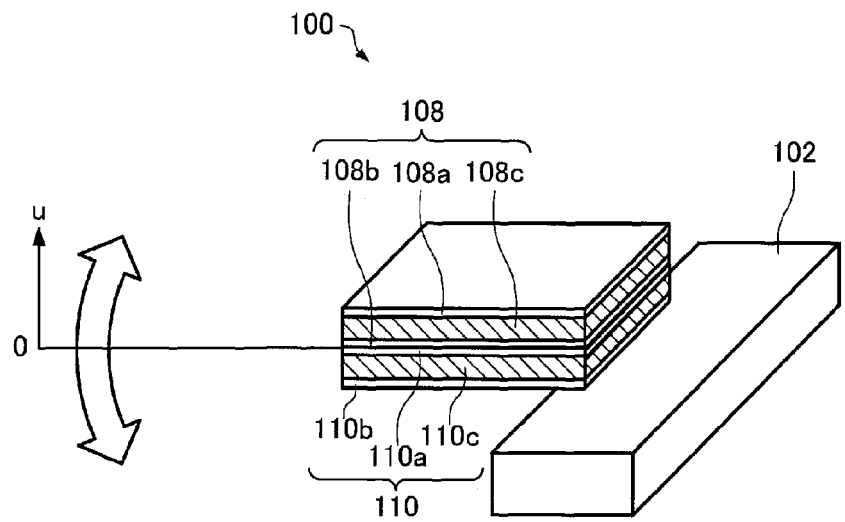
FIGS. 1A and 1B are explanatory diagrams showing a structure of a power generation unit according to an embodiment of the invention.
Figure 1B:
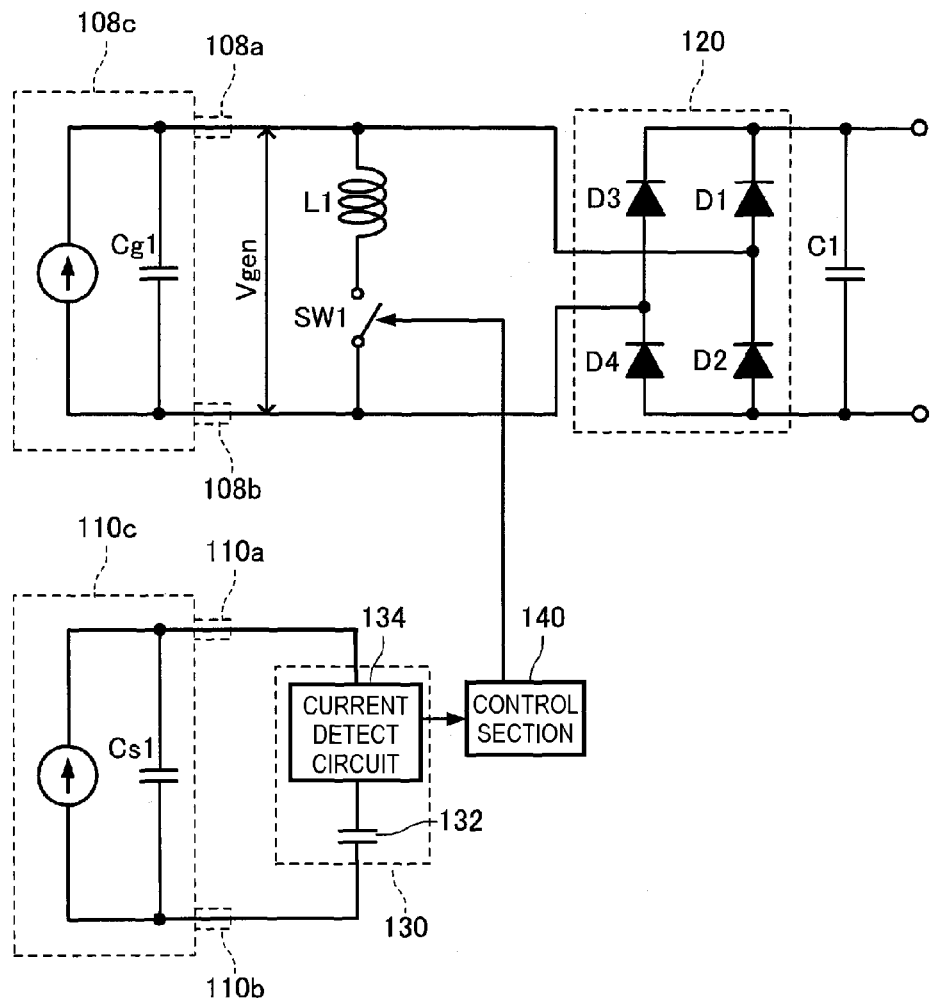

Hereinafter, an embodiment of the invention will be explained along the following procedure to thereby clarify the content of the invention described above.
A. Embodiment
A-1. Structure of Power Generation Unit
A-2. Operation of Power Generation Unit
A-3. Operation Principle of Power Generation Unit
A-4. Switching Timing of Switch
B. First Modified Example
C. Second Modified Example
D. Third Modified Example
E. Electronic Apparatus, Transportation Device, and Battery A. Embodiment A-1. Structure of Power Generation Unit FIGS. 1A and 1B are explanatory diagrams showing a structure of a power generation unit 100 according to the present embodiment. FIG. 1A shows a mechanical structure of the power generation unit 100, and FIG. 1B shows an electrical structure thereof.

The power generation unit 100 according to the present embodiment is provided with a first piezoelectric device 108 having a pair of electrodes, a second piezoelectric device 110 stacked on the first piezoelectric device 108, a switch SW1 electrically connected between the pair of electrodes, a current detection section 130 for detecting the current generated in the second piezoelectric device 110, and a control section 140 for controlling the switch SW1. The control section 140 electrically connects the switch SW1 for a predetermined period of time in at least either one of the case in which the current detected by the current detection section 130 reaches a level equal to or higher than a first reference value or the case in which the current reaches a level equal to or lower than a second reference value.

The mechanical structure of the power generation unit 100 according to the embodiment is arranged to be a cantilever structure in which one ends of the first piezoelectric device 108 and the second piezoelectric device 110 stacked each another are fixed to a base 102, so as to be able to deform while switching the deformation direction. The base 102 is preferably fixed inside the power generation unit 100. The first piezoelectric device 108 is configured including a piezoelectric element 108c formed of a piezoelectric material such as lead zirconium titanate (PZT), and a pair of electrodes each formed of a metal thin film on the surface of the piezoelectric element 108c, namely a first electrode (an upper electrode) 108a and a second electrode (a lower electrode) 108b. The first electrode (the upper electrode) 108a and the second electrode (the lower electrode) 108b are disposed so as to be opposed to each other across the piezoelectric element 108c. The second piezoelectric device 110 is configured including a piezoelectric element 110c formed of a piezoelectric material such as lead zirconium titanate (PZT), and a pair of electrodes each formed of a metal thin film on the surface of the piezoelectric element 110c, namely a first electrode (an upper electrode) 110a and a second electrode (a lower electrode) 110b. The first electrode (the upper electrode) 110a and the second electrode (the lower electrode) 110b are disposed so as to be opposed to each other across the piezoelectric element 110c. In the example shown in FIG. 1A, the second electrode 108b of the first piezoelectric device 108 and the first electrode 110a of the second piezoelectric device 110 are stacked each other while being insulated from each other. Although the first piezoelectric device 108 and the second piezoelectric device 110 have the same shape in the example shown in FIG. 1A, it is not necessary required for them to have the same shape. For example, if the first piezoelectric device 108 has the maximum installable length (the length along the direction of getting away from the base 102) and width (the width with respect to the direction of getting away from the base 102), the amount of power generated by the first piezoelectric device 108 becomes large. On the other hand, if the second piezoelectric device 110 has the minimum installable width, the displacement resistance caused by the second piezoelectric device 110 is reduced, and therefore, the power generation efficiency is improved.

Since the first piezoelectric device 108 and the second piezoelectric device 110 are fixed to the base 102 at the one ends, if a vibration or the like is applied thereto, the tips on the far side from the base 102 vibrate significantly as indicated by the outlined arrow in the drawing. As a result, a compression force and a tensile force act on the first piezoelectric device 108 and the second piezoelectric device 110 alternately. Then, the piezoelectric element 108c of the first piezoelectric device 108 generates positive and negative charges due to the piezoelectric effect, and the charges appear in the first electrode 108a and the second electrode 108b. Similarly, the piezoelectric element 110c of the second piezoelectric device 110 generates positive and negative charges due to the piezoelectric effect, and the charges appear in the first electrode 110a and the second electrode 110b.

FIG. 1B shows an example of the circuit diagram of the power generation unit 100 according to the present embodiment. The switch SW1 is disposed between the first electrode 108a and the second electrode 108b as the pair of electrodes of the first piezoelectric device 108. Further, in the example shown in FIG. 1B, the inductor L1 is connected in series to the switch SW1. The piezoelectric element 108c of the first piezoelectric device 108 can electrically be expressed as a current source and a capacitor (a capacitive component) Cg1 for storing charges. The inductor L1 is connected in parallel to the piezoelectric element 108c, and forms a resonant circuit including the first piezoelectric device 108. In other words, the inductor L1 forms an electrical resonant circuit together with the capacitive component Cg1 of the piezoelectric device 108c. The piezoelectric element 110c of the second piezoelectric device 110 can electrically be expressed as a current source and a capacitor (a capacitive component) Cs1 for storing charges.

The current detection section 130 detects the current generated in the second piezoelectric device 110. In the example shown in FIG. 1B, the current detection section 130 is configured including a capacitor 132 connected in parallel to the second piezoelectric device 110, and a current detect circuit 134 for detecting the current flowing in the capacitor 132.

The control section 140 controls to set the switch SW1 to the ON/OFF states. The control section 140 can also be configured including a central processing unit (CPU). The control section 140 electrically connects the switch SW1 for a predetermined period of time in at least either one of the case in which the current detected by the current detection section 130 reaches a level equal to or higher than a first reference value Iref1 or the case in which the current reaches a level equal to or lower than a second reference value Iref2. Further, in the period other than the predetermined period of time described above, it is also possible for the control section 140 to electrically connect the switch SW1 at the timing at which the deformation direction of the first piezoelectric device 108 is switched, and then electrically disconnect the switch SW1 at the timing at which a predetermined time has elapsed. Further, it is also possible for the control section 140 to electrically connect the switch SW1 at the timing at which the deformation direction of the first piezoelectric device 108 is switched based on the current detected by the current detection section 130. The details of the operation of the current detection section 130 and the control section 140 will be described later.

Further, the first electrode 108a and the second electrode 108b provided to the piezoelectric element 108c of the first piezoelectric device 108 are connected to a rectifier 120 for rectifying the current generated by the first piezoelectric device 108. In the present embodiment, the rectifier 120 is a full bridge rectifier composed of four diodes D1 through D4. By forming the rectifier 120 with the full bridge rectifier, it is possible to efficiently extract the charge generated by the first piezoelectric device 108 to thereby efficiently generate the electrical power. Further, a capacitor (an output capacitor) C1 for storing the current after the rectification for driving an electrical load is connected to the rectifier 120. In other words, the capacitor C1 is connected in parallel to the first piezoelectric device 108 via the rectifier 120. I should be noted that the capacitor C1 is not an essential constituent, and can be provided if need arises.

On the other hand, the second piezoelectric device 110 is provided for controlling the switch SW1, and the first electrode 110a and the second electrode 110b provided to the second piezoelectric device 110 are connected to the current detection section 130. Therefore, it is assumed hereinafter that the first piezoelectric device 108 may be referred to as a "power-generating piezoelectric device," and the second piezoelectric device 110 may be referred to as a "controlling piezoelectric device."

A-2. Operation of Power Generation Unit

Figure 2A:
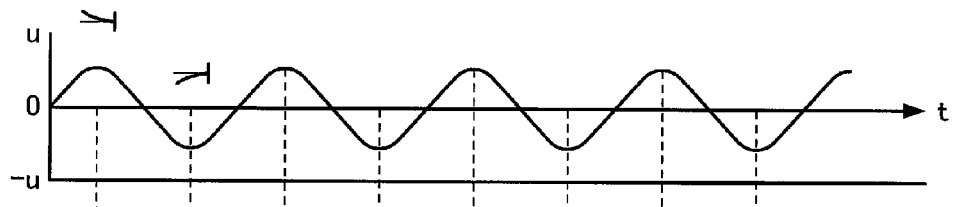
FIGS. 2A through 2D are explanatory diagrams showing an operation of the power generation unit according to the embodiment.
Figure 2B:
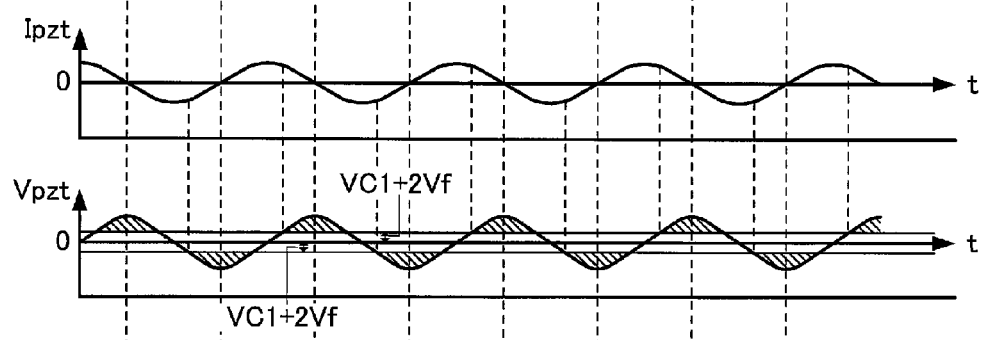

FIGS. 2A through 2D are explanatory diagrams showing the operation of the power generation unit 100 according to the present embodiment. FIG. 2A shows how the displacement u of the tip (an end portion on the far side from the base 102) of the first piezoelectric device 108 varies due to the vibration of the first piezoelectric device 108. It should be noted that the positive displacement u represents the state (the state in which the upper surface side of the first piezoelectric device 108 has a concave shape) in which the first piezoelectric device 108 is warped upward, and the negative displacement (−u) represents the state (the state in which the lower surface side of the first piezoelectric device 108 has a concave shape) in which the first piezoelectric device 108 is warped downward. Further, FIG. 2B shows the state of the current generated in the piezoelectric element 108c due to the deformation of the first piezoelectric device 108, and the electromotive force caused inside the piezoelectric element 108c as a result thereof. It should be noted that in FIG. 2B the state of the charge generated in the piezoelectric element 108c is expressed as an amount of the charge (i.e., a current Ipzt) generated per unit time, and the electromotive force generated in the piezoelectric element 108c is expressed as the voltage Vpzt generated between the first electrode 108a and the second electrode 108b.

It should be noted that as described above with reference to FIGS. 1A and 1B, the second piezoelectric device 110 stacked on the first piezoelectric device 108 is also provided, and when the first piezoelectric device 108 deforms, the piezoelectric element 110c also deforms similarly to the piezoelectric element 108c. Therefore, the current Ipzt2 similar to the current Ipzt shown in FIG. 2B, and the voltage Vpzt2 similar to the voltage Vpzt shown in FIG. 2B are also generated inside the piezoelectric element 110c in just the same manner as the piezoelectric element 108c.

As shown in FIGS. 2A and 2B, during the period in which the displacement of the first piezoelectric device 108 keeps increasing, the piezoelectric element 108c generates a current in the positive direction (i.e., the current Ipzt takes a positive value), and the voltage Vpzt between the first electrode 108a and the second electrode 108b increases in the positive direction in conjunction therewith. If the voltage Vpzt in the positive direction exceeds the sum of the voltage VC1 of the capacitor C1 and a twofold of the forward voltage drop Vf of the diode constituting the full bridge rectifier 120, namely VC1+2Vf, the charge generated thereafter can be taken out as a direct current and stored in the capacitor C1. Further, during the period in which the displacement of the first piezoelectric device 108 keeps decreasing, the piezoelectric element 108c generates a current in the negative direction (i.e., the current Ipzt takes a negative value), and the voltage Vpzt between the first electrode 108a and the second electrode 108b increases in the negative direction in conjunction therewith. If the voltage Vpzt in the negative direction exceeds the sum of VC1 and 2Vf of the full bridge rectifier 120, the charge generated can be taken out as a direct current and stored in the capacitor C1. In other words, even when keeping the switch SW1 shown in FIG. 1B in the OFF state, the charge can be stored in the capacitor C1 regarding the part indicated by hatching in FIG. 2B.

Figure 2C:

The charge amount (a power generation efficiency) which can be taken out from the piezoelectric element 108c in a predetermined period of time differs according to the timing at which the switch SW1 is set to the ON state, and the power generation efficiency is maximized in the case in which the switch SW1 is set to the ON state at the timing at which the deformation direction of the first piezoelectric device 108 is switched as shown in FIG. 2C. Hereinafter, the operation in the case in which the power generation efficiency is maximized will firstly be explained.

Figure 2D:
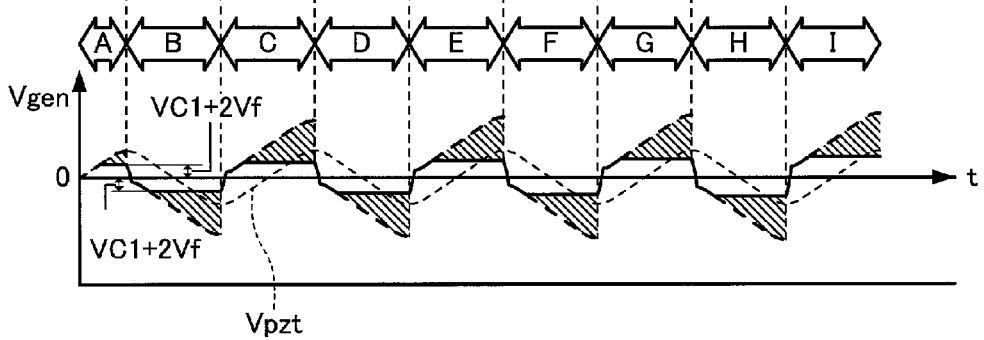

It is assumed that the control section 140 set the switch SW1 to the ON state at the timing shown in FIG. 2C. Then, as shown in FIG. 2D, there occurs a phenomenon that the voltage waveform between the first electrode 108a and the second electrode 108b varies as if it is shifted at the moment that the switch SW1 is set to the ON state. Specifically, in the period B indicated as "B" in FIG. 2D, such a voltage waveform indicated by the thick dotted line as is obtained by shifting the voltage Vpzt indicated by the thin dotted line corresponding to the electromotive force of the piezoelectric element 108c toward the negative direction appears between the first electrode 108a and the second electrode 108b. The reason that such a phenomenon occurs will be described later. Further, in the period C indicated as "C" in FIG. 2D, there appears such a voltage waveform indicated by the thick dotted line as is obtained by shifting the waveform of the voltage Vpzt corresponding to the electromotive force of the piezoelectric element 108c toward the positive direction. Similarly, thereafter, in each of the period D, the period E, the period F, and so on, there appears such a voltage waveform indicated by the thick dotted line as is obtained by shifting the waveform of the voltage Vpzt corresponding to the electromotive force of the piezoelectric element 108c toward the positive direction or the negative direction. Further, in the part (the part indicated by hatching in FIG. 2D) where the voltage waveform thus shifted exceeds the sum of VC1 and 2Vf, the charge generated in the piezoelectric element 108c can be stored in the capacitor C1. It should be noted that as a result of the flow of the charge from the piezoelectric element 108c to the capacitor C1, the voltage Vgen between the first electrode 108a and the second electrode 108b is clipped at the voltage corresponding to the sum of VC1 and 2Vf. As a result, the waveform indicated by the thick solid line in FIG. 2D is obtained as the voltage waveform of the voltage between the first electrode 108a and the second electrode 108b.

As is obvious from the comparison between the case of keeping the switch SW1 in the OFF state shown in FIG. 2B and the case of setting the switch SW1 to the ON state at the timing when the deformation direction of the first piezoelectric device 108 is switched as shown in FIG. 2D, in the power generation unit 100 according to the present embodiment, it becomes possible to efficiently store the charge in the capacitor C1 by setting the switch SW1 to the ON state at appropriate timing. Therefore, the power generation unit 100 according to the present embodiment is provided with the second piezoelectric device 110 for control in order to set the switch SW1 to the ON state at appropriate timing, and detects the current generated in the second piezoelectric device 110 to control the switch SW1. This point will be explained later in detail.

Further, if the charge is stored in the capacitor C1 and the inter-terminal voltage of the capacitor C1 increases, the shift amount of the voltage waveform also increases in accordance therewith. For example, in comparison between the period B (the state in which no charge is stored in the capacitor C1) in FIG. 2D and the period H (the state in which the charge is stored a little bit in the capacitor C1) in FIG. 2D, the shift amount of the voltage waveform is larger in the period H. Similarly, in comparison between the period C and the period I in FIG. 2D, the shift amount of the voltage waveform is larger in the period I in which the charge stored in the capacitor C1 is increased. Although the reason why such a phenomenon occurs will be described later, as a result, in the power generation unit 100 according to the present embodiment, it becomes possible to store the voltage higher than the voltage Vpzt, which is generated between the first electrode 108a and the second electrode 108b by deforming the piezoelectric element 108c, in the capacitor C1. As a result, it becomes unnecessary to provide an additional step-up circuit, and thus it becomes possible to obtain a small-sized and highly efficient power generation unit.

A-3. Operation Principle of Power Generation Unit

Figure 3A:
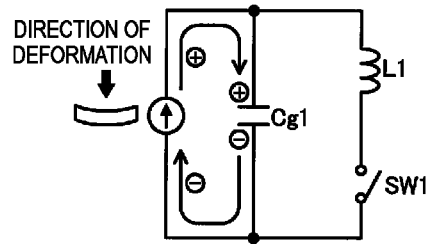
FIGS. 3A through 3F are explanatory diagrams conceptually showing an anterior half of the operation principle of the power generation unit according to the embodiment.

FIGS. 3A through 3F are explanatory diagrams conceptually showing an anterior half of the operation principle of the power generation unit 100 according to the present embodiment. Further, FIGS. 4A through 4F are explanatory diagrams conceptually showing a posterior half of the operation principle of the power generation unit 100 according to the present embodiment. FIGS. 3A through 3F conceptually show the movement of the charge in the capacitor Cg1 when setting the switch SW1 to the ON state in accordance with the deformation of the piezoelectric element 108c. FIG. 3A shows the state in which the piezoelectric element 108c (the first piezoelectric device 108, to be precise) is deformed upward (so that the upper surface side has a concave shape). If the piezoelectric element 108c is deformed upward, the current in the positive direction flows from the current source, then the charge is stored in the capacitor Cg1, and the voltage in the positive direction is generated between the terminals of the piezoelectric element 108c. The voltage value increases as the deformation of the piezoelectric element 108c increases. Then, the switch SW1 is set to the ON state at the timing (the timing at which the amount of the charge reaches a peak; see FIG. 3B) at which the deformation of the piezoelectric element 108c reaches a peak.

Figure 3F:
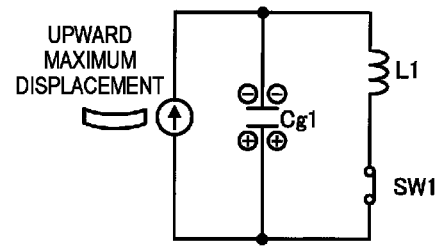
Figure 3B:
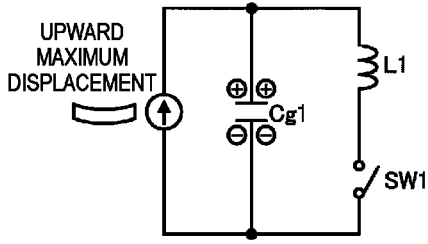
Figure 3E:
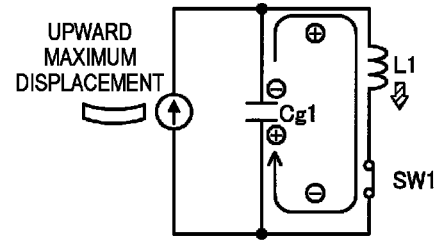
Figure 3C:
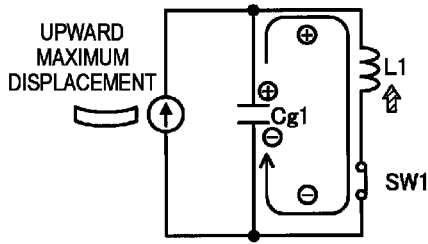

FIG. 3C shows the state immediately after setting the switch SW1 to the ON state. Since the charge is stored in the capacitor Cg1, the charge is urged to flow into the inductor L1. Although a magnetic flux is generated (the magnetic flux increases) when a current flows through the inductor L1, the inductor L1 has a nature (a self-induction effect) of generating a back electromotive force in the direction of preventing the change in the magnetic flux penetrating the inductor itself. Since the magnetic flux is urged to increase due to the charge flowing therethrough when the switch SW1 is set to the ON state, the back electromotive force occurs in the direction (in other words, the direction of hindering the flow of the charge) of preventing the magnetic flux from increasing. Further, the level of the back electromotive force is proportional to the variation rate (the variation per unit time) of the magnetic flux. In FIG. 3C, the back electromotive force generated in the inductor L1 in such a manner as described above is indicated by the arrow provided with hatching. Since such a back electromotive force occurs, only a little amount of the charge in the piezoelectric element 108c flows out when setting the switch SW1 to the ON state. In other words, the current flowing through the inductor L1 increases only gradually.

Figure 3D:
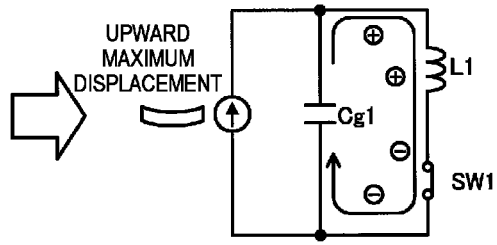

Subsequently, when the current flowing through the inductor L1 reaches a peak value, the variation rate of the magnetic flux reaches "0," and therefore, the back electromotive force reaches "0" as shown in FIG. 3D. Then, the current starts decreasing in turn. Then, since the magnetic flux penetrating the inductor L1 decreases, the electromotive force occurs in the inductor L1 in the direction (the direction of urging the current to flow) of preventing the decrease in the magnetic flux (see FIG. 3E). As a result, the current continues to flow through the inductor L1 while pulling out the charge from the capacitor Cg1 due to the electromotive force. Then, if no loss occurs during the migration of the charge, all the charge generated by the deformation of the piezoelectric element 108c is migrated, and there occurs the state (i.e., the state in which the positive charge is distributed on the lower surface side of the piezoelectric element 108c, and the negative charge is distributed on the upper surface side) looked as if the positive and negative charges are replaced with each other. FIG. 3F shows the state in which all the charge generated by the deformation of the piezoelectric element 108c has been migrated.

If the switch SW1 is kept in the ON state without change, a converse phenomenon to the content described above occurs in turn. Specifically, the positive charge on the lower surface side of the piezoelectric element 108c is urged to flow into the inductor L1, and at this moment, the back electromotive force in the direction of hindering the flow of the charge occurs in the inductor L1. Subsequently, when the current flowing through the inductor L1 reaches the peak and then takes a downward turn, the electromotive force in the direction (the direction of urging the current to continue to flow) of preventing the current from decreasing occurs in turn in the inductor L1. As a result, there occurs the state (the state shown in FIG. 3B) in which all the positive charge once located on the lower surface side of the piezoelectric element 108c has been migrated to the upper surface side. The positive charge having returned to the upper surface side of the piezoelectric element 108c in this way is migrated again to the lower surface side in such a manner as described above with reference to FIGS. 3B through 3F.

As described above, if the switch SW1 is set to the ON state in the state in which the charge is stored in the capacitor Cg1 and is then kept in the ON state, there occurs a kind of resonant phenomenon in which the direction of the current is reversed alternately between the piezoelectric element 108c and the inductor L1. Further, the period of the resonant phenomenon corresponds to the resonance period T of the so-called LC resonant circuit, and is therefore obtained by the formula $T=2\pi(LC)^{0.5}$, assuming that the value (capacitance) of the capacitor Cg1 included in the piezoelectric element 108c is C, the value (inductance) of the inductive component of the inductor L1 is L. Therefore, the time immediately after (the state shown in FIG. 3C) setting the switch SW1 to the ON state until the state shown in FIG. 3F occurs is obtained as T/2.

Figure 4A:
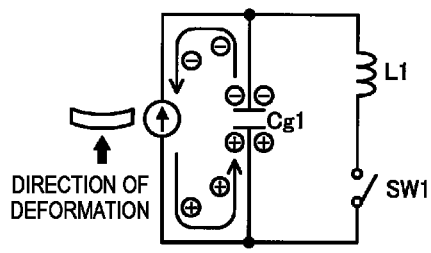
FIGS. 4A through 4F are explanatory diagrams conceptually showing a posterior half of the operation principle of the power generation unit according to the embodiment.
Figure 4B:
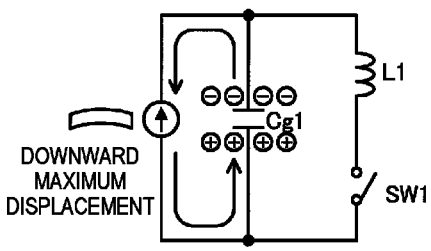
Figure 4C:
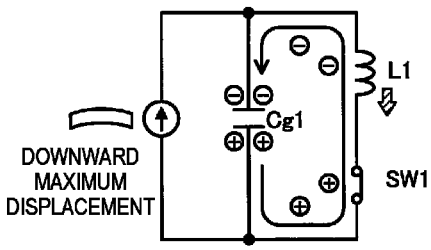
Figure 4F:
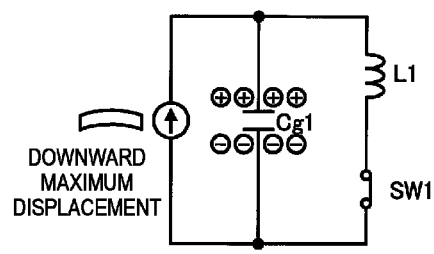
Figure 4E:
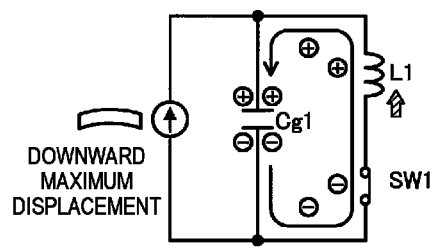
Figure 4D:
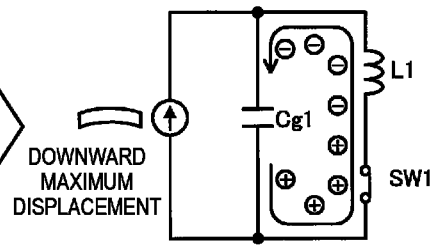

Therefore, the switch SW1 is set to the OFF state as shown in FIG. 4A at the time point when T/2 has elapsed after setting the switch SW1 to the ON state. Then, the piezoelectric element 108c (the first piezoelectric device 108, to be precise) is in turn deformed downward (so that the lower surface side has a concave shape) from the present state. Although the piezoelectric element 108c is deformed upward in FIG. 3A described above, the piezoelectric element 108c is deformed downward in FIG. 4A, and therefore, the current flows from the current source in the negative direction, and the charge is stored in the capacitor Cg1 so that the voltage between the terminals of the piezoelectric element 108c increases toward the negative side. Further, since the positive charge is distributed on the lower surface side of the piezoelectric element 108c and the negative charge is distributed on the upper surface side thereof in the stage prior to deforming the piezoelectric element 108c (the first piezoelectric device 108, to be precise) downward as described above with reference to FIGS. 3A through 3F, it results that a new positive charge is stored on the lower surface side and a new negative charge is stored on the upper surface side in addition to these charges. FIG. 4B shows the state in which the new charges are stored in the piezoelectric element 108c by deforming the piezoelectric element 108c (the first piezoelectric device 108, to be precise) in the state of setting the switch SW1 to the OFF state.

Then, when setting the switch SW1 to the ON state in this state, the positive charge stored on the lower surface side of the piezoelectric element 108c is urged to flow into the inductor L1. At this moment, since the back electromotive force occurs in the inductor L1 (see FIG. 4C), the current starts flowing gradually, and eventually reaches the peak, and then makes a downward turn. Then, the electromotive force occurs in the inductor L1 in the direction (the direction of urging the current to continue to flow) of preventing the current from decreasing (see FIG. 4E), and the current continues to flow due to the electromotive force. Eventually, all the positive charge having been distributed on the lower surface side of the piezoelectric element 108c is migrated to the upper surface side, and there occurs the state in which all the negative charge once distributed on the upper surface side has been migrated to the lower surface side (see FIG. 4F). Further, the time necessary for migrating all the positive charge on the lower surface side to the upper surface side and migrating all the negative charge on the upper surface side to the lower surface side is equal to the time T/2 corresponding to a half of the resonance period T of the LC resonant circuit. Therefore, by setting the switch SW1 to the OFF state when the time T/2 has elapsed after setting the switch SW1 to the ON state to thereby deform in turn the piezoelectric element 108c (the first piezoelectric device 108, to be precise) upward (so that the upper surface side has a concave shape), the positive and negative charges can further be stored in the piezoelectric element 108c.

As explained hereinabove, in the power generation unit 100 according to the present embodiment, by deforming the piezoelectric element 108c to thereby generate the charge, and then connecting the piezoelectric element 108c to the inductor L1 to thereby form the resonant circuit for a half cycle of the resonance period T, the distributions of the positive and negative charges in the piezoelectric element 108c are reversed. Subsequently, the piezoelectric element 108c is in turn deformed in the opposite direction to thereby generate new charges. Since the distributions of the positive and negative charges in the piezoelectric element 108c have been reversed, it results that the charges newly generated are stored in the piezoelectric element 108c. Subsequently, the piezoelectric element 108c is connected again to the inductor L1 for a half cycle of the resonance period T to thereby reverse the distributions of the positive and negative charges in the piezoelectric element 108c, and then the piezoelectric element 108c is deformed in the opposite direction. By repeating such operations, it is possible to increase the charge stored in the piezoelectric element 108c every time the piezoelectric element 108c is deformed in a repeated manner.

As described above with reference to FIGS. 2A through 2D, in the power generation unit 100 according to the present embodiment, the peculiar phenomenon of shifting the waveform of the voltage generated between the first electrode 108a and the second electrode 108b occurs every time the switch SW1 is set to the ON state, and the phenomenon occurs due to the following mechanism. That is, in the period A shown in FIG. 2D, for example, although the voltage is generated between the first electrode 108a and the second electrode 108b in accordance with the deformation of the piezoelectric element 108c (the first piezoelectric device 108, to be precise), since the first electrode 108a and the second electrode 108b are connected to the rectifier 120, the charge corresponding to the part exceeding the voltage of the sum of VC1 and 2Vf flows into the capacitor C1 connected to the rectifier 120. As a result, when setting the switch SW1 to the ON state at the time point when the deformation of the first piezoelectric device 108 reaches the peak, the positive and negative charges remaining in the piezoelectric element 108c at that moment are migrated via the inductor L1, and the locations of the positive and negative charges in the piezoelectric element 108c are replaced with each other.

Then, when deforming the first piezoelectric device 108 in the opposite direction in the state in which the locations of the positive and negative charges are replaced with each other, the voltage waveform due to the piezoelectric effect appears between the first electrode 108a and the second electrode 108b of the piezoelectric element 108c. In other words, it results that the voltage variation due to the deformation of the piezoelectric element 108c occurs in the state in which the polarities of the first electrode 108a and the second electrode 108b of the piezoelectric element 108c are replaced with each other. As a result, there appears in the period B shown in FIG. 2D the voltage waveform looked as if the voltage waveform generated in the piezoelectric element 108c due to the deformation of the first piezoelectric device 108 is shifted. However, as described above, since the charge corresponding to the part exceeding the voltage of the sum of VC1 and 2Vf flows into the capacitor C1, the voltage between the first electrode 108a and the second electrode 108b of the piezoelectric element 108c is clipped at the voltage of the sum of VC1 and 2Vf. Subsequently, when setting the switch SW1 to the ON state for the time a half as long as the resonance period T, the locations of the positive and negative charges remaining in the piezoelectric element 108c are replaced with each other. Then, by the deformation of the first piezoelectric device 108 starting from that state, the voltage waveform due to the piezoelectric effect appears in the piezoelectric element 108c. Therefore, it results that there appears also in the period C shown in FIG. 2D the voltage waveform looked as if the voltage waveform due to the deformation of the first piezoelectric device 108 is shifted.

Further, as described above with reference to FIGS. 2A through 2D, in the power generation unit 100 according to the present embodiment, there also occurs the phenomenon that the shift amount of the voltage waveform gradually increases as the first piezoelectric device 108 repeats the deformation. Therefore, there can be obtained a significant advantage that the voltage higher than the electrical potential difference caused between the first electrode 108a and the second electrode 108b due to the piezoelectric effect of the piezoelectric element 108c can be stored in the capacitor C1. Such a phenomenon is caused by the following mechanism.

Firstly, as shown in the period A or the period B in FIG. 2D, in the case in which the capacitor C1 has not been charged, since the charge flows from the piezoelectric element 108c into the capacitor C1 when the voltage generated between the terminals of the piezoelectric element 108c exceeds 2Vf of the rectifier 120, the voltage appearing between the first electrode 108a and the second electrode 108b is clipped at 2Vf. However, as the charge is stored in the capacitor C1 in such a manner as described above, the voltage between the terminals of the capacitor C1 increases. Then, thereafter, the charge does not flow into the capacitor C1 from the piezoelectric element 108c until the voltage between the first electrode 108a and the second electrode 108b reaches a voltage higher than the sum of VC1 and 2Vf. Therefore, the value at which the voltage between the first electrode 108a and the second electrode 108b is clipped rises gradually as the charge is stored in the capacitor C1.

In addition, as described above with reference to FIGS. 3A through 3F and 4A through 4F, on the condition that the charge is prevented from flowing out from the piezoelectric element 108c, the charges in the piezoelectric element 108c continues to increase every time the piezoelectric element 108c (the first piezoelectric device 108, to be precise) is deformed, and the voltage between the first electrode 108a and the second electrode 108b rises in conjunction therewith. Therefore, if the loss of the charge when flowing through the inductor L1 and the switch SW1 is not considered, it is possible to increase the voltage between the first electrode 108a and the second electrode 108b. Therefore, according to the power generation unit 100 of the present embodiment, it becomes possible to generate the electrical power in the condition in which the voltage is automatically raised to the voltage necessary to drive the electrical load without providing an additional step-up circuit.

A-4. Switching Timing of Switch

As explained hereinabove, in the power generation unit 100 according to the present embodiment, by applying the cyclic deformation to the piezoelectric element 108c (the first piezoelectric device 108, to be precise), and connecting the piezoelectric element 108c to the inductor L1 for a period of time a half as long as the resonance period T at the timing when the deformation direction is switched, it is possible to obtain an excellent feature that miniaturization can easily be achieved because the charge can efficiently be stored in the capacitor C1, and in addition, no step-up circuit is required. However, due to the circumstances of the operation speed of the control section 140 and the switch SW1, the timing at which the control section 140 sets the switch SW1 to the ON state does not necessarily coincide completely with the timing at which the deformation direction of the first piezoelectric device 108 is switched. However, it is possible to step-up the voltage Vgen generated between the first electrode 108a and the second electrode 108b by setting the switch SW1 to the ON state for the period of time half as long as the resonance period T of the LC resonant circuit at a cycle coinciding with the characteristic vibration period of the laminate body composed of the first piezoelectric device 108 and the second piezoelectric device 110 even if the timing at which the switch SW1 is set to the ON state does not completely coincide with the timing at which the deformation direction of the first piezoelectric device 108 is switched. Hereinafter, the reason therefor will be explained.

Figure 5A:
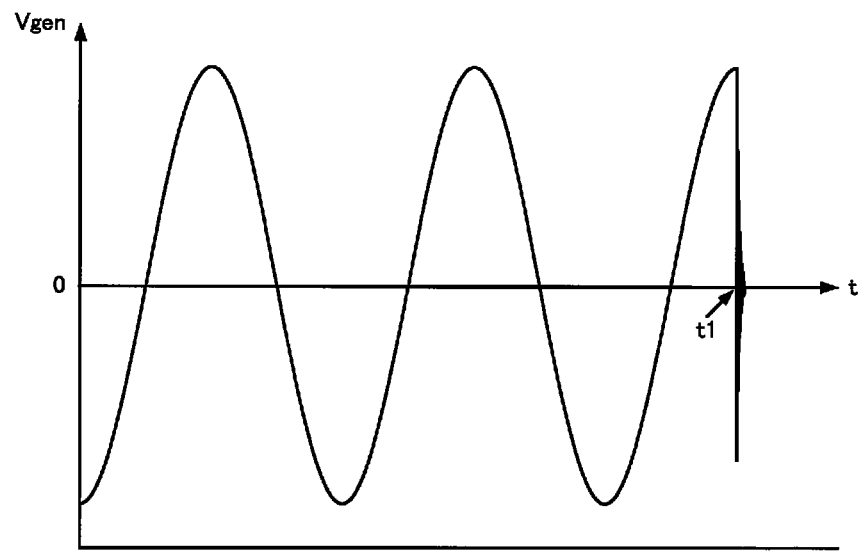
FIGS. 5A and 5B are explanatory diagrams showing the reason that it is possible to raise the voltage between terminals of a piezoelectric element even if the timing of setting a switch to the ON state is an arbitrary timing.
Figure 5B:
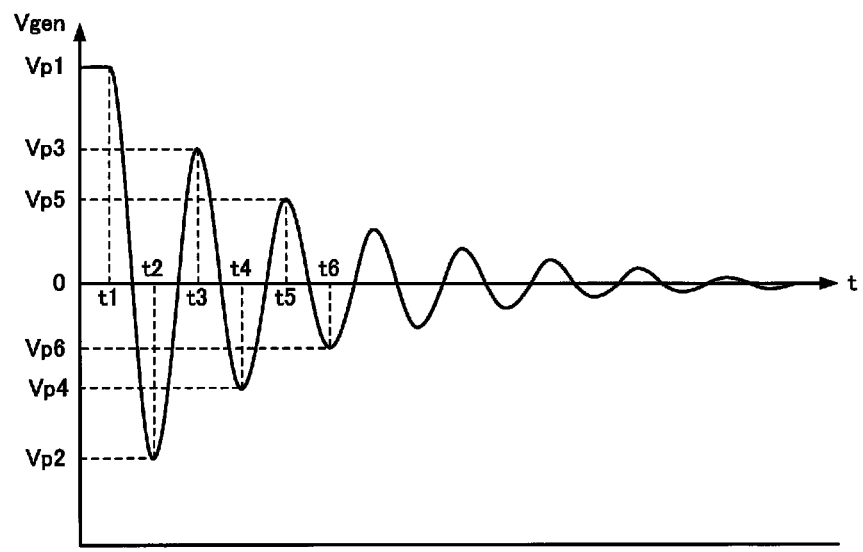

FIG. 5A shows the state of the voltage Vgen generated between the first electrode 108a and the second electrode 108b if the switch SW1 is not set to the OFF state after setting the switch SW1 to the ON state at the time point t1 at which the deformation direction of the first piezoelectric device 108 is switched. FIG. 5B is a diagram obtained by enlarging a part of the waveform shown in FIG. 5A on and after the time point t1. It should be noted that it is assumed in the example shown in FIGS. 5A and 5B that the rectifier 120 and the capacitor C1 are eliminated.

At the time point t1, the voltage Vgen has a peak, and by setting the switch SW1 to the ON state, the voltage Vgen is attenuated while alternately showing positive and negative peak values Vp1, Vp2, Vp3, Vp4, Vp5, Vp6, . . . at a period (the time points t1, t2, t3, t4, t5, t6, . . . ) half as long as the resonance period T of the LC circuit. If the switch SW1 is set to the OFF state at the time point t2 when T/2 has elapsed from the time point t1, the shift amount of the voltage Vgen described above is obtained as the sum (|Vp1|+|Vp2|) of the absolute value of Vp1 and the absolute value of Vp2. It should be noted that, as explained with reference to FIGS. 3A through 3F, and 4A through 4F, since Vp2 is a voltage value when the positive and negative charges of the capacitive component Cg1 are replaced with each other, the larger the absolute value of Vp1 is, the larger the absolute value of Vp2 becomes. Therefore, the larger the absolute value of Vp1 is, the larger the shift amount of the voltage Vgen becomes.

Figure 6:
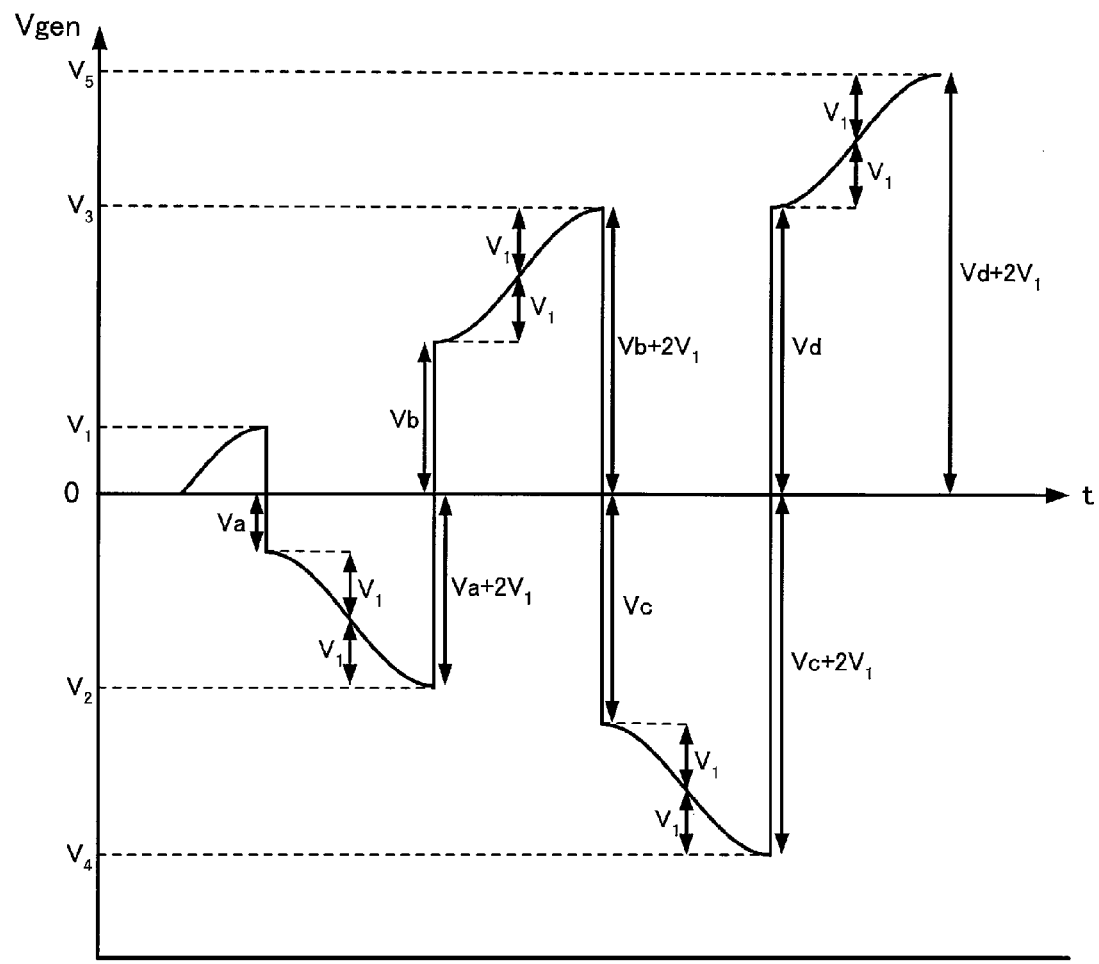
FIG. 6 is an explanatory diagram showing the reason that it is possible to raise the voltage between the terminals of the piezoelectric element even if the timing of setting the switch to the ON state is an arbitrary timing.

FIG. 6 shows the state of the voltage Vgen generated between the first electrode 108a and the second electrode 108b in the case in which the switch SW1 is set to the ON state only for the period of T/2 every time the deformation direction of the first piezoelectric device 108 is switched. It should be noted that it is assumed in also the example shown in FIG. 6 that the rectifier 120 and the capacitor C1 are eliminated. Assuming that the amplitude of the voltage Vpzt due to the electromotive force generated by the piezoelectric element 108c is constant, if the switch SW1 is set to the ON state for the period of T/2 at the timing at which the voltage Vgen first reaches the voltage value $V_1$ as a positive peak value, the voltage Vgen is shifted $V_1$+Va toward the negative side. Then, the voltage value $V_2$ of Vgen when the second time the switch SW1 is set to the ON state is $V_2=-(Va+2V_1)$, and if the switch SW1 is set to the ON state for the period of T/2, the voltage Vgen is shifted Vb+Va+$2V_1$ toward the positive side. Similarly, the voltage value $V_3$ of Vgen when the third time the switch SW1 is set to the ON state is $V_3=Vb+2V_1$, and if the switch SW1 is set to the ON state for the period of T/2, the voltage Vgen is shifted Vc+Vb+$2V_1$ toward the negative side. Similarly, the voltage value $V_4$ of Vgen when the fourth time the switch SW1 is set to the ON state is $V_4=-(Vc+2V_1)$, and if the switch SW1 is set to the ON state for the period of T/2, the voltage Vgen is shifted Vd+Vc+$2V_1$ toward the positive side. Similarly, the voltage value $V_5$ of Vgen when the fifth time the switch SW1 is set to the ON state is $V_5=Vd+2V_1$. Here, since the voltage value $V_2$ is obtained as $V_2=-(Va+2V_1)$, $|V_2|>|V_1|$ is obviously true. Further, since the reference symbols $V_1$, $V_2$ denote the voltage values corresponding to the voltage value Vp1 shown in FIG. 5B, and the reference symbols Va, Vb denotes the voltage values corresponding to the voltage value Vp2 shown in FIG. 5B, and $|V_2|>|V_1|$ is true, Vb>Va is necessarily fulfilled. Therefore, since $V_2$ is obtained as $V_2=-(Va+2V_1)$, $V_3$ is obtained as $V_3=Vb+2V_1$, and Vb>Va is true, $|V_3|>|V_2|$ is true. Similarly, since $|V_3|>|V_2|$ is true, Vc>Vb is necessarily fulfilled, and since $V_3=Vb+2V_1$, $V_4=-(Vc+2V_1)$ are obtained, and Vc>Vb is true, $|V_4|>|V_3|$ is true. Similarly, since $|V_4|>|V_3|$ is true, Vd>Vc is necessarily fulfilled, and since $V_4=-(Vc+2V_1)$, $V_5=Vd+2V_1$ are obtained, and Vd>Vc is true, $|V_5|>|V_4|$ is true. In essence, by setting the switch SW1 to the ON state for the period of T/2 at the timing at which the deformation direction of the first piezoelectric device 108 is switched, the absolute value of the voltage Vgen generated between the first electrode 108a and the second electrode 108b is stepped up in such a manner as $|V_1|<|V_2|<|V_3|<|V_4|<|V_5|< \ldots$.

Figure 7A:
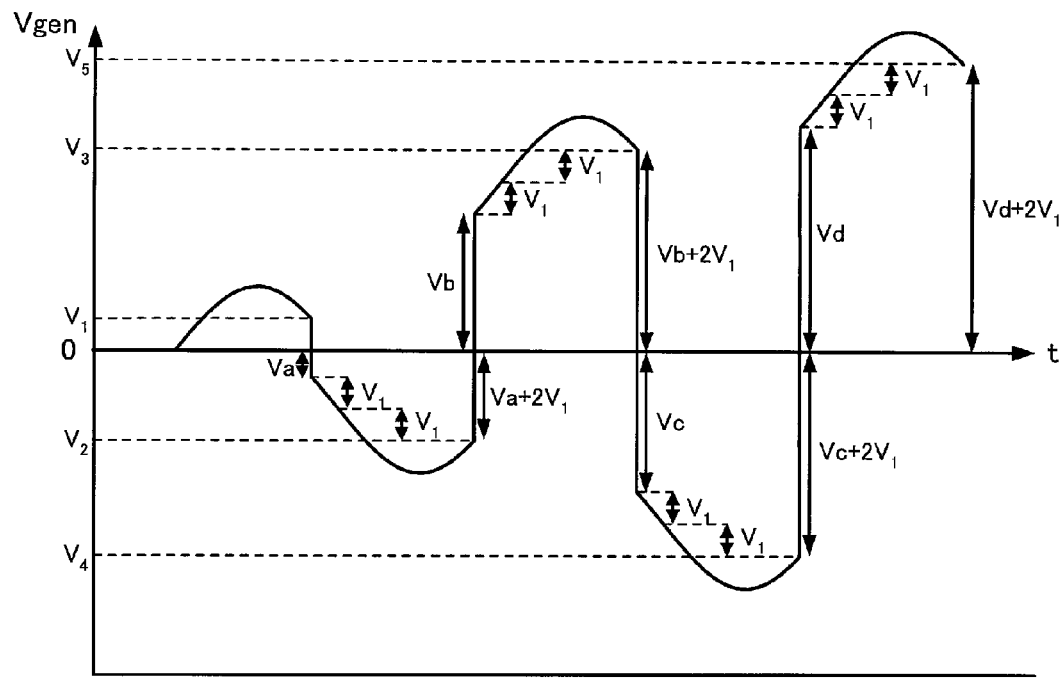
FIGS. 7A and 7B are explanatory diagrams showing the reason that it is possible to raise the voltage between the terminals of the piezoelectric element even if the timing of setting the switch to the ON state is an arbitrary timing.
Figure 7B:
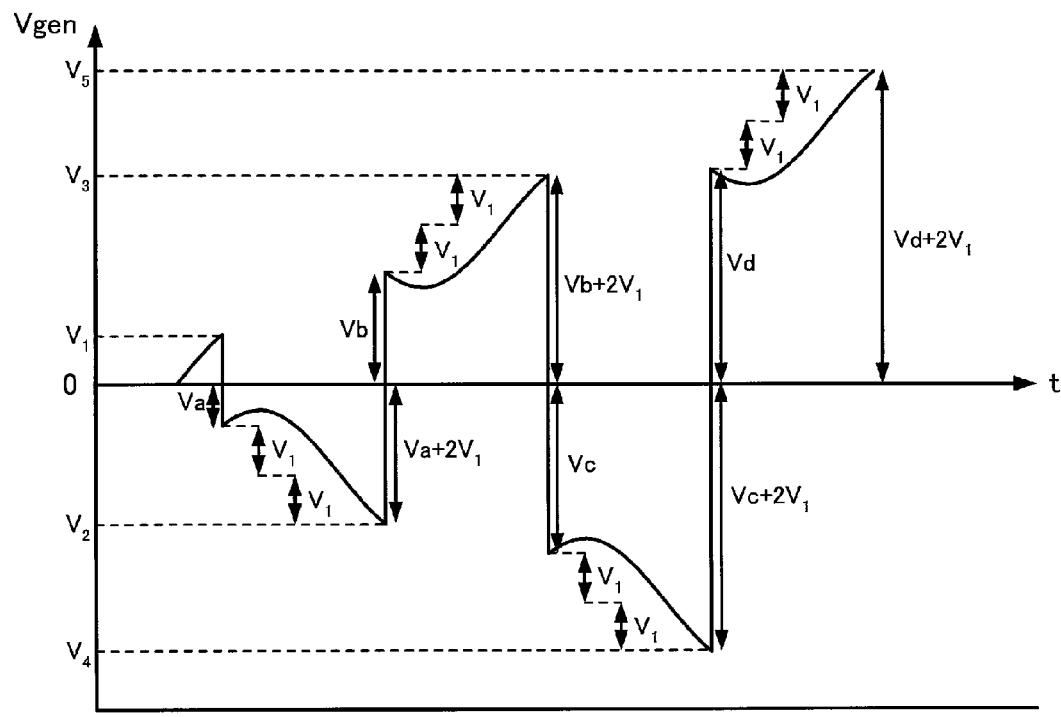

The same can be applied to the case in which the timing of switching the deformation direction of the first piezoelectric device 108 and the timing of setting the switch SW1 to the ON state are shifted from each other. FIG. 7A shows the state of the voltage Vgen generated between the first electrode 108a and the second electrode 108b in the case in which the switch SW1 is set to the ON state for the period of T/2 after the timing at which the deformation direction of the first piezoelectric device 108 is switched, and FIG. 7B shows the state of the voltage Vgen generated between the first electrode 108a and the second electrode 108b in the case in which the switch SW1 is set to the ON state for the period of T/2 prior to the timing at which the deformation direction of the first piezoelectric device 108 is switched. It should be noted that it is assumed in also the examples shown in FIGS. 7A and 7B that the rectifier 120 and the capacitor C1 are eliminated.

In the examples shown in FIGS. 7A and 7B, similarly to the example shown in FIG. 6, the voltage Vgen takes the voltage value $V_2=-(Va+2V_1)$ when the second time the switch SW1 is set to the ON state with respect to the voltage value $V_1$ when the switch SW1 is first set to the ON state, the voltage value $V_3=Vb+2V_1$ when the third time the switch SW1 is set to the ON state, the voltage value $V_4=-(Vc+2V_1)$ when the fourth time the switch SW1 is set to the ON state, the voltage value $V_5=Vd+2V_1$ when the fifth time the switch SW1 is set to the ON state, and so on. Here, since the voltage values $V_2, V_3, V_4, V_5, \ldots$ are expressed by the same formulas as those of the voltage values $V_2, V_3, V_4, V_5, \ldots$ in the case of FIG. 6, $V_2>V_1$, $V_3>V_2, V_4>V_3, V_5>V_4, \ldots$ are also fulfilled. Therefore, also in the case in which the switch SW1 is set to the ON state for the period of T/2 at the timing shifted before or after the timing at which the deformation direction of the first piezoelectric device 108 is switched, the voltage Vgen is stepped up in such a manner as $|V_1|<|V_2|<|V_3|<|V_4|<|V_5|< \ldots$. It should be noted that since the higher the voltage value $V_1$ is, the larger the voltage values Va, Vb, Vc, Vd, . . . become, the rate of stepping up the voltage Vgen is higher and the power generation efficiency is higher in the example shown in FIG. 6 than in the examples shown in FIGS. 7A and 7B.

It should be noted that in the case (the case of $V_1=0$ in FIGS. 7A and 7B) in which the switch SW1 is set to the ON state for the period of T/2 at the timing at which the displacement of the first piezoelectric device 108 vanishes (the voltage Vgen reaches 0), the resonance of the resonant circuit fails to occur, and the voltage Vgen does not rise.

As explained hereinabove, even if the switch SW1 is set to the ON state at an arbitrary timing (it should be noted that the timing at which the displacement of the first piezoelectric device 108 vanishes (the voltage Vgen is equal to 0) is excepted), the voltage generated between the first electrode 108a and the second electrode 108b can be stepped up by setting the switch SW1 to the ON state for the period half as long as the resonance period T of the LC resonant circuit.

Figure 8:
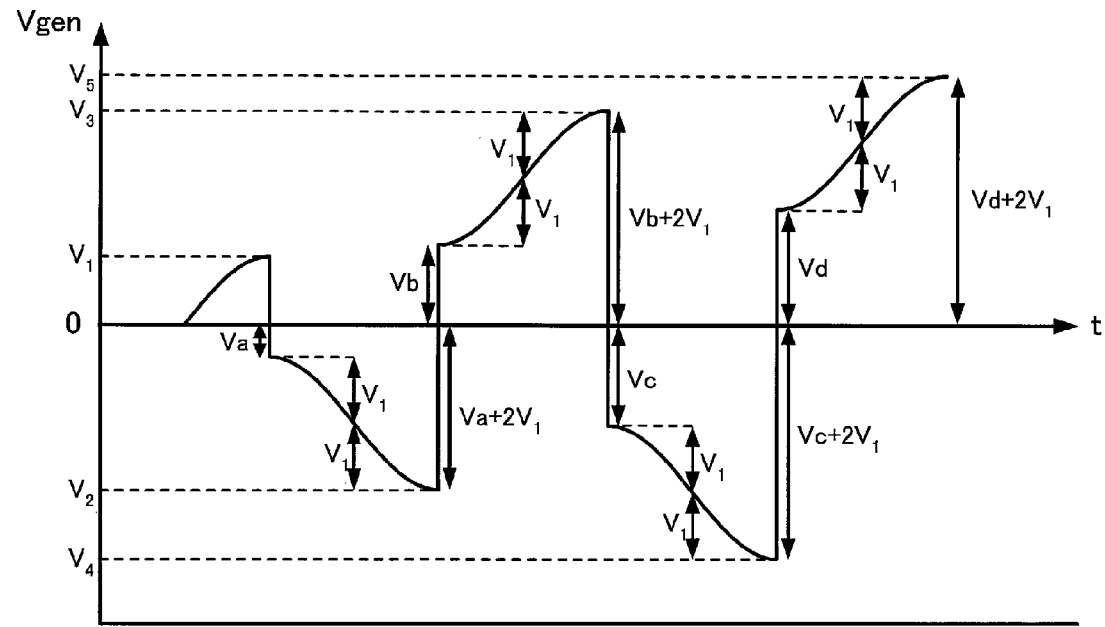
FIG. 8 is a diagram showing a voltage waveform between the terminals of the piezoelectric element in the case of setting the switch to the ON state for a period of time three halves as long as the resonance period of an LC resonant circuit.

It should be noted that although it is preferable to set the switch SW1 to the ON state for the period half as long as the resonance period T of the LC resonant circuit in order to improve the power generation efficiency, it is possible to at least step up the voltage Vgen generated between the first electrode 108a and the second electrode 108b even by setting the switch SW1 to the ON state for a predetermined period of time. For example, FIG. 8 shows an example of the voltage Vgen generated between the first electrode 108a and the second electrode 108b in the case in which the switch SW1 is set to the ON state only for the period three-halves times as long as the resonance period T at the timing at which the deformation direction of the first piezoelectric device 108 is switched. In essence, the case corresponds to the case in which the switch SW1 is set to the ON state at the time point t1 shown in FIG. 5B, and is then set to the OFF state at the time point t3. It should be noted that it is assumed in also the example shown in FIG. 8 that the rectifier 120 and the capacitor C1 are eliminated.

In the example shown in FIG. 8, similarly to the example shown in FIG. 6, the voltage Vgen takes the voltage value $V_2=-(Va+2V_1)$ when the second time the switch SW1 is set to the ON state with respect to the voltage value $V_1$ when the switch SW1 is first set to the ON state, the voltage value $V_3=Vb+2V_1$ when the third time the switch SW1 is set to the ON state, the voltage value $V_4=-(Vc+2V_1)$ when the fourth time the switch SW1 is set to the ON state, the voltage value $V_5=Vd+2V_1$ when the fifth time the switch SW1 is set to the ON state, and so on, and the voltage Vgen is stepped up in such a manner as $|V_1|<|V_2|<|V_3|<|V_4|<|V_5|< \ldots$. It should be noted that since the higher the voltage value $V_1$ is, the larger the voltage values Va, Vb, Vc, Vd, . . . become, the rate of stepping up the voltage Vgen is higher and the power generation efficiency is higher in the example shown in FIG. 6 than in the example shown in FIG. 8.

Figure 9:
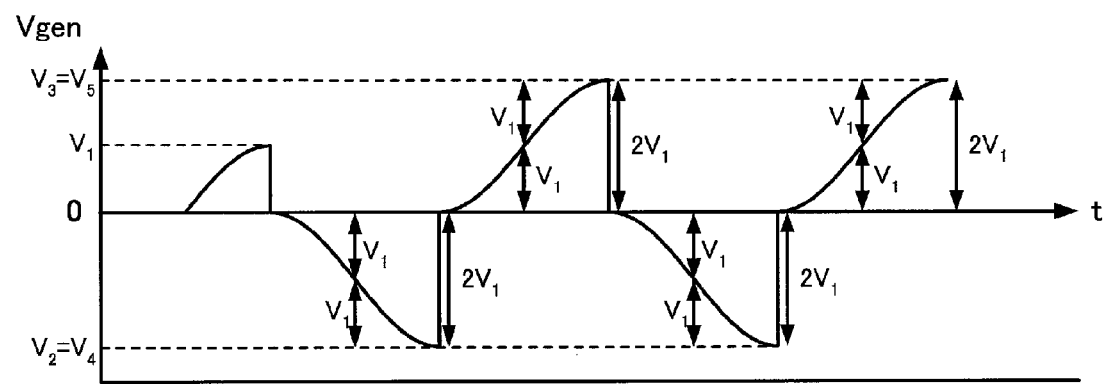
FIG. 9 is a diagram showing a voltage waveform between the terminals of the piezoelectric element in the case of setting the switch to the ON state for a period of time a quarter as long as the resonance period of the LC resonant circuit.

On the other hand, FIG. 9 shows an example of the voltage Vgen generated between the first electrode 108a and the second electrode 108b in the case in which the switch SW1 is set to the ON state only for the period a quarter as long as the resonance period T at the timing at which the deformation direction of the first piezoelectric device 108 is switched. In essence, the case corresponds to the case in which the switch SW1 is set to the ON state at the time point t1 shown in FIG. 5B, and is then set to the OFF state at the time point (t1+t2)/2. It should be noted that it is assumed in also the example shown in FIG. 9 that the rectifier 120 and the capacitor C1 are eliminated.

In the example shown in FIG. 9, the voltage Vgen takes the voltage value $V_2=-2V_1$ when the second time the switch SW1 is set to the ON state with respect to the voltage value $V_1$ when the switch SW1 is first set to the ON state, the voltage value $V_3=2V_1$ when the third time the switch SW1 is set to the ON state, the voltage value $V_4=-2V_1$ when the fourth time the switch SW1 is set to the ON state, the voltage value $V_5=2V_1$ when the fifth time the switch SW1 is set to the ON state, and so on. In other wards, the voltage Vgen can be stepped up to $2V_1$, but is not stepped up to a level exceeding $2V_1$.

Similarly, also in the case of setting the switch SW1 to the ON state for the period obtained by multiplying either one of ¾, ⁵⁄₄, ⁷⁄₄, ⁹⁄₄, . . . by the resonance period T at the timing at which the deformation direction of the first piezoelectric device 108 is switched, the voltage values of $V_2=-2V_1$, $V_3=2V_1, V_4=-2V_1, V_5=2V_1, \ldots$ are obtained, and the voltage Vgen can be stepped up to $2V_1$, but is not stepped up beyond $2V_1$.

According to the phenomenon described above, due to the resonance of the LC resonant circuit, by setting the switch SW1 to the OFF state at least when the polarity of the voltage Vgen is changed to the opposite polarity to the polarity thereof at the time point when the switch SW1 is set to the ON state, the voltage Vgen continues to rise. In essence, it is possible to efficiently step up the voltage Vgen by setting the predetermined period during which the switch SW1 is set to the ON state to the time at least longer than (n+¼)T and shorter than (n+¾)T (n denotes an arbitrary integer equal to or greater than 0) with respect to the resonance period T of the LC resonant circuit.

As described above, in the case of setting the switch SW1 to the ON state for the period half as long as the resonance period T of the LC resonant circuit, the shift amount when switching the switch SW1 takes the maximum value, and therefore, the highest power generation efficiency can be obtained. Therefore, in the power generation unit 100 according to the present embodiment, the control section 140 sets the switch SW1 to the ON state at the period coinciding with the characteristic vibration period of the laminate body of the first piezoelectric device 108 and the second piezoelectric device 110, and then sets the switch SW1 to the OFF state after the period half as long as the resonance period T of the LC resonant circuit has elapsed.

However, it is not so easy to set the switch SW1 to the ON state at the timing when the deformation direction of the first piezoelectric device 108 is switched. For example, assuming that the amount of the displacement of the first piezoelectric device 108 takes the maximum value at the timing at which the deformation direction of the first piezoelectric device 108 is switched, it is also possible to adopt the configuration in which the switch SW1 is set to the ON state at the timing at which the first piezoelectric device 108 has the maximum displacement using a mechanical contact. However, if the adjustment of the contact fails, it results that the efficiency is dramatically degraded. Therefore, in the power generation unit 100 according to the present embodiment, the current Ipzt2 generated in the second piezoelectric device 110 is detected to thereby set the switch SW1 to the ON state. The timing at which the deformation direction of the second piezoelectric device 110 is switched coincides with the timing (the timing at which the current value reaches 0) at which the direction of the current Ipzt2 due to the charge generated by the second piezoelectric device 110 is switched. Therefore, by detecting the current Ipzt2 generated in the second piezoelectric device 110, the switch SW1 can easily be set to the ON state (a conduction state) at the timing at which the deformation direction of the first piezoelectric device 108 is switched.

Figure 10A:
FIGS. 10A through 10C are explanatory diagrams showing the reason that a switch SW1 can be controlled at an appropriate timing by detecting a current generated in a second piezoelectric device.
Figure 10B:
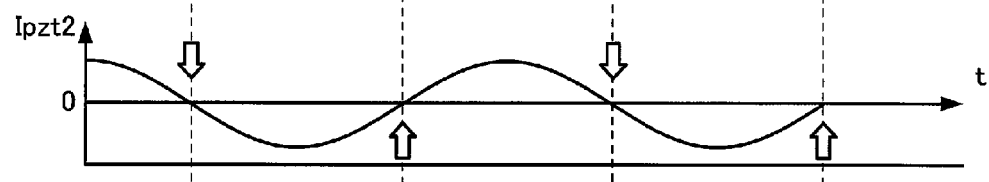
Figure 10C:
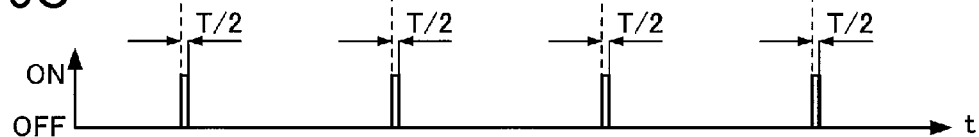

FIGS. 10A through 10C are explanatory diagrams showing the reason that the switch SW1 can be controlled at an appropriate timing by detecting the current Ipzt2 generated in the second piezoelectric device 110 (in other words, based on the current detected by the current detection section 130). FIG. 10A shows the displacement of the first piezoelectric device 108. Further, FIG. 10B shows how the current Ipzt2 generated in the second piezoelectric device 110 varies due to the vibration of the first piezoelectric device 108.

As described above with reference to FIGS. 3A through 3F, 4A through 4F, 5A, 5B, 6, 7A, 7B, 8, and 9, the electrical power can be generated with the highest efficiency in the case of setting the switch SW1 to the ON state at the timing at which the displacement u of the first piezoelectric device 108 reaches the extreme value. Further, as is obvious from the comparison between FIGS. 10A and 10B, the timing at which the displacement u of the first piezoelectric device 108 takes the extreme value coincides with the timing at which the current Ipzt2 generated in the second piezoelectric device 110 vanishes. The reason therefor is that since the second piezoelectric device 110 is not connected to the inductor L1 or the capacitor C1, the variation in the charge is directly reflected on the variation in the current Ipzt2 generated in the second piezoelectric device 110.

Therefore, as indicated by the outlined arrow in FIG. 10B, by detecting the timing at which the current Ipzt2 generated in the second piezoelectric device 110 reaches 0, and then setting the switch SW1 to the ON state for a predetermined period (e.g., the period (T/2) half as long as the resonance period T of the LC resonant circuit described above) starting from that timing, it becomes possible to efficiently generate the electrical power.

Figure 11:
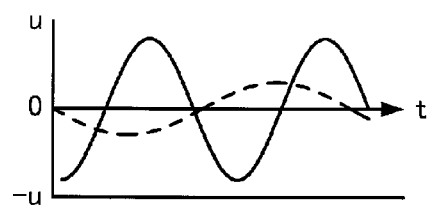
FIG. 11 is an explanatory diagram showing the displacement of a first piezoelectric device in the case of applying a vibration to the first piezoelectric device.

FIG. 11 is an explanatory diagram showing the displacement of the first piezoelectric device 108 in the case of applying a vibration to the first piezoelectric device 108, and shows how the displacement u of the tip of the first piezoelectric device 108 varies due to the vibration of the first piezoelectric device 108. The solid line shown in FIG. 11 represents the displacement of the first piezoelectric device 108 in the case in which the switch SW1 is in the OFF state, and the dotted line represents the displacement of the first piezoelectric device 108 in the case in which the switch SW1 is in the ON state, namely the case in which the first electrode 108a and the second electrode 108b of the first piezoelectric device 108 are shorted each other via the switch SW1. It should be noted that the same force is applied to the first piezoelectric device 108 in both of the case (the solid line) in which the switch SW1 is in the OFF state and the case (the dotted line) in which the switch SW1 is in the ON state shown in FIG. 11. As is obvious from the comparison between the dotted line and the solid line shown in FIG. 11, the deformation of the first piezoelectric device 108 is reduced to a lower level in the case of setting the switch SW1 to the ON state to thereby short the first electrode 108a and the second electrode 108b than in the case of setting the switch SW1 to the OFF state. The reason therefor is that in the state of shorting the first electrode 108a and the second electrode 108b of the first piezoelectric device 108, since the charge generated on the surfaces of the piezoelectric element 108c flows between the first electrode 108a and the second electrode 108b thus shorted each other to thereby consume the charge as the electrical power in the resistance component of the piezoelectric element 108c and the resistance component between the first electrode 108a and the second electrode 108b, the deformation of the first piezoelectric device 108 is braked, and the first piezoelectric device 108 becomes difficult to deform.

In the power generation unit 100 according to the present embodiment, the deformation amount of the first piezoelectric device 108 is controlled using such a characteristic of the first piezoelectric device 108. Specifically, since the second piezoelectric device 110 is disposed so as to be laminated with the first piezoelectric device 108, and these devices deform to the same extent, the larger the deformation amount of the first piezoelectric device 108 is, the larger the absolute value of the current Ipzt2 generated in the second piezoelectric device 110 is. Further, by setting the switch SW1 to the ON state to thereby short the first electrode 108a and the second electrode 108b of the first piezoelectric device 108 in at least either one of the case in which the current Ipzt2 reaches a level equal to or higher than the first reference value Iref1, or the case in which the current Ipzt2 reaches a level equal to or lower than the second reference value Iref2, the first piezoelectric device 108 is prevented from deforming beyond a predetermined deformation amount. The absolute value of the first reference value Iref1 and the absolute value of the second reference value Iref2 can be set to the same value, or can be set to respective values different from each other.

Figure 12A:
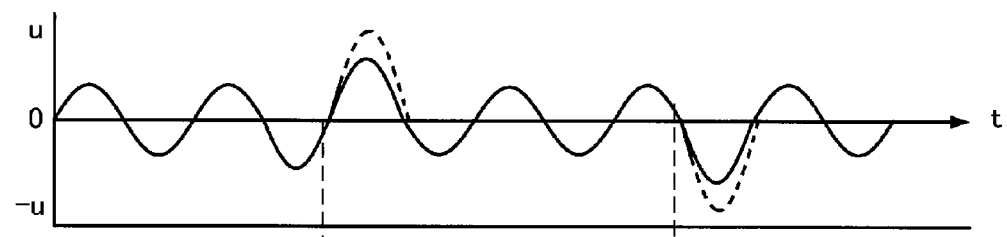
FIGS. 12A through 12C are explanatory diagrams showing how the deformation of the first piezoelectric device is reduced by connecting the switch in the case in which the current generated in the second piezoelectric device reaches a level equal to or higher than a first reference value and the case in which the current reaches a level equal to or lower than a second reference value.
Figure 12B:
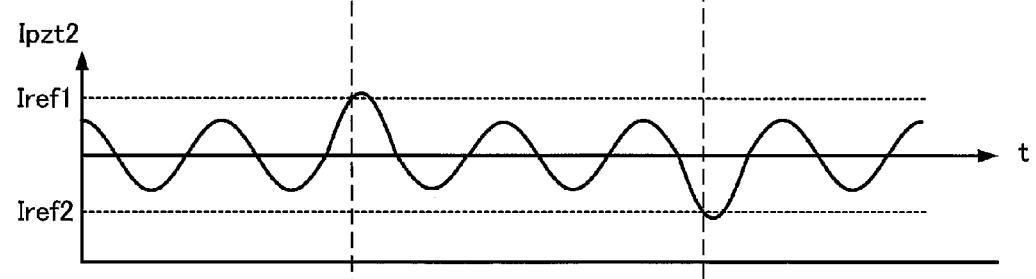
Figure 12C:
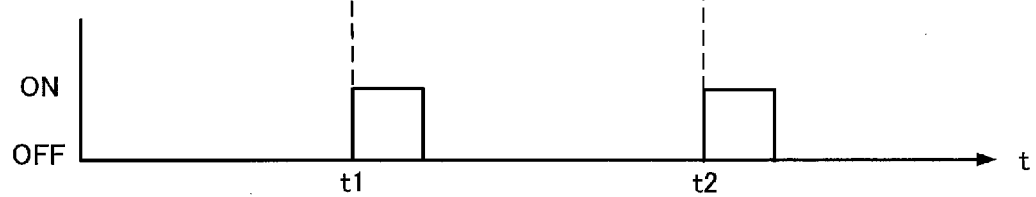

FIGS. 12A through 12C are explanatory diagrams showing how the deformation of the first piezoelectric device 108 is reduced by connecting the switch SW1 in the case in which the current Ipzt2 generated in the second piezoelectric device 110 reaches the level equal to or higher than the first reference value Iref1 and the case in which the current Ipzt2 reaches the level equal to or lower than the second reference value Iref2. FIG. 12A shows the displacement of the first piezoelectric device 108. Further, FIG. 12B shows how the current Ipzt2 generated in the second piezoelectric device 110 varies due to the vibration of the first piezoelectric device 108. As shown in FIG. 12B, the current Ipzt2 generated in the second piezoelectric device 110 reaches the first reference value Iref1 at the timing t1. As shown in FIG. 12A, the timing t1 corresponds to the timing at which the rate of the deformation of the first piezoelectric device 108 is equal to or higher than a certain value. Then, as shown in FIG. 12C, by setting the switch SW1 to the ON state at the timing t1 for a predetermined period of time to thereby short the first electrode 108a and the second electrode 108b of the first piezoelectric device 108, the first piezoelectric device 108 is prevented from deforming. Specifically, although it is assumed that the first piezoelectric device 108 is significantly deformed as indicated by the dotted line in FIG. 12A unless the switch SW1 is set to the ON state, the deformation of the first piezoelectric device 108 is reduced to the extent indicated by the solid line by setting the switch SW1 to the ON state. Further, as shown in FIG. 12B, the current Ipzt2 generated in the second piezoelectric device 110 reaches the second reference value Iref2 at the timing t2. As shown in FIG. 12A, the timing t2 corresponds to the timing at which the rate of the deformation of the first piezoelectric device 108 is equal to or higher than a certain value. Then, as shown in FIG. 12C, by setting the switch SW1 to the ON state at the timing t2 for a predetermined period of time to thereby short the first electrode 108a and the second electrode 108b of the first piezoelectric device 108, the first piezoelectric device 108 is prevented from deforming. Specifically, although it is assumed that the first piezoelectric device 108 is significantly deformed as indicated by the dotted line in FIG. 12A unless the switch SW1 is set to the ON state, the deformation of the first piezoelectric device 108 is reduced to the extent indicated by the solid line by setting the switch SW1 to the ON state.

Further, since the current Ipzt2 generated in the second piezoelectric device 110 has a current value with a level proportional to the rate of the deformation of the second piezoelectric device 110 (and the first piezoelectric device 108), whether or not the switch SW1 should be connected can be determined at the timing before the displacement of the first piezoelectric device 108 becomes large. Therefore, the deformation of the first piezoelectric device 108 can more surely be reduced compared to the case of, for example, directly detecting the displacement of the first piezoelectric device 108, or the case of detecting the voltage generated in the second piezoelectric device 110, the voltage varying in proportion to the displacement of the first piezoelectric device 108.

As described above, since the deformation amount of the first piezoelectric device 108 can be controlled, it is possible to prevent the first piezoelectric device 108 and the second piezoelectric device 110 from colliding with the members, which are disposed in the periphery of the first piezoelectric device 108 and the second piezoelectric device 110, and the housing. As a result, it becomes unnecessary to dispose a buffer for absorbing the impact of the collision, and it becomes possible to miniaturize the power generation unit 100.

Figure 13:
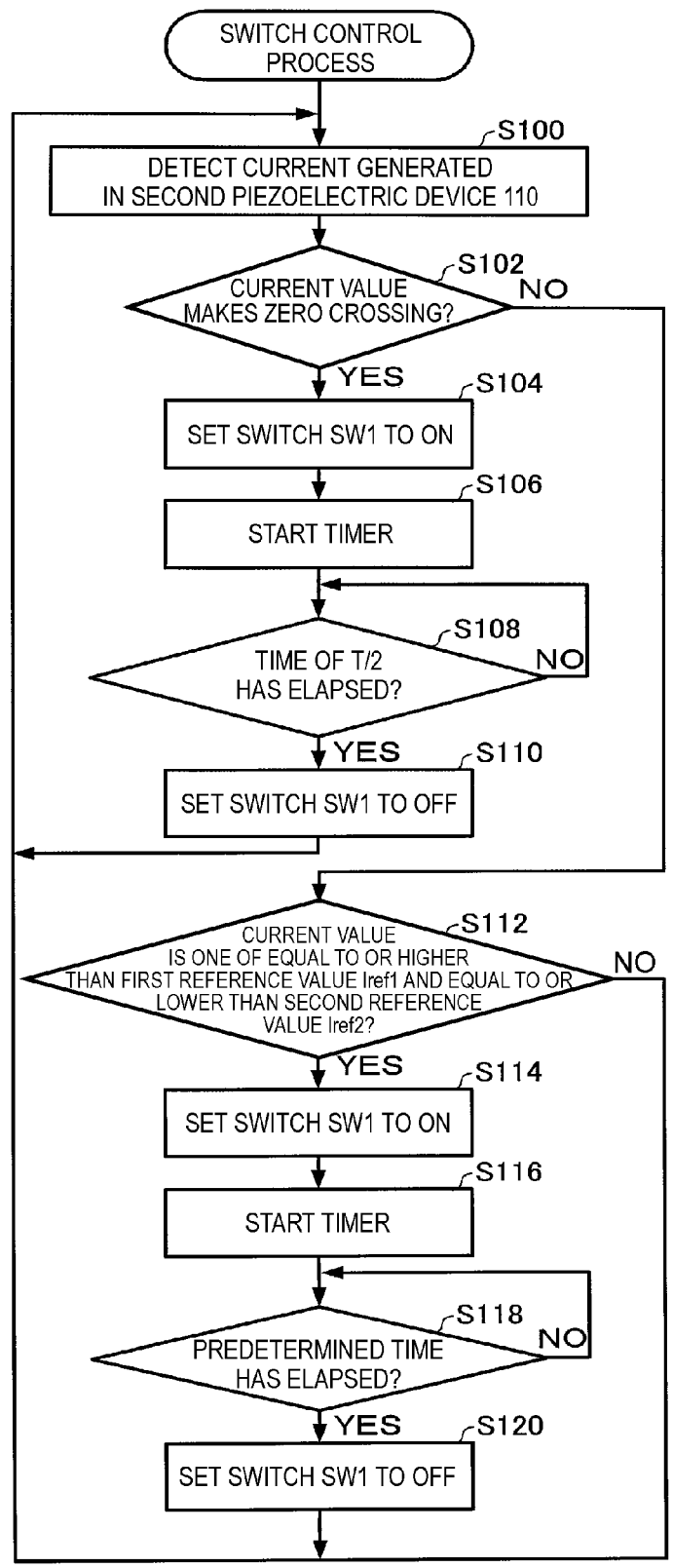
FIG. 13 is a flowchart for explaining a switch control process as an example of a method of controlling the power generation unit according to the embodiment.

FIG. 13 is a flowchart for explaining a switch control process as an example of a method of controlling the power generation unit 100 according to the present embodiment. The method of controlling the power generation unit 100 according to the present embodiment includes a step of detecting the current generated in the second piezoelectric device 110, and a step of connecting the switch SW1 for a predetermined period of time in at least either one of the case in which the current detected reaches a level equal to or higher than the first reference value Iref1, or the case in which the current reaches a level equal to or lower than the second reference value Iref2. Further, the method of controlling the power generation unit 100 according to the present embodiment can also include a step of electrically connecting the switch SW1 at the timing at which the deformation direction of the first piezoelectric device 108 is switched, and then electrically disconnecting the switch SW1 at the timing at which a predetermined time has elapsed in the period other than the predetermined period of time described above.

In the switch control process shown in FIG. 13, firstly, the current detection section 130 detects (step S100) the current generated in the second piezoelectric device 110. In the present embodiment, the current detect circuit 134 of the current detection section 130 detects the current flowing in the capacitor 132 to thereby detect the current generated in the second piezoelectric device 110. Since the capacitor 132 is connected in parallel to the piezoelectric device 110 as shown in FIG. 1B, the current having the same phase as that of the current generated in the second piezoelectric device 110 flows in the capacitor 132. Therefore, by detecting the current flowing in the capacitor 132, the timing (the timing at which the current vanishes) at which the direction of the current due to the charge generated in the second piezoelectric device 110 is switched can easily be detected.

Figure 14:
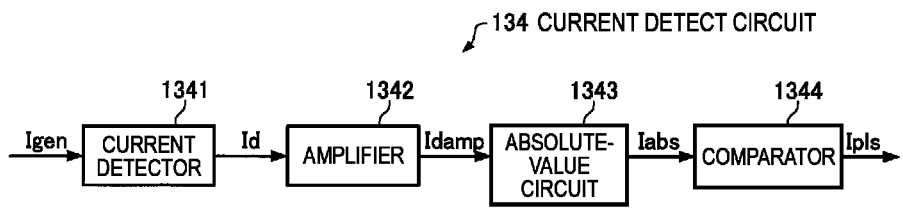
FIG. 14 is a block diagram showing an example of a configuration of a current detect circuit.

FIG. 14 is a block diagram showing an example of a configuration of the current detect circuit 134.

As a current detector 1341, a device known to the public such as a Hall element current sensor or a shunt resistance can be used.

An amplifier 1342 amplifies an output signal (Id) of the current detector 1341 at a predetermined gain. An absolute-value circuit 1343 outputs an absolute value signal of an output signal (Idamp) of the amplifier 1342. It should be noted that the amplifier 1342 and the absolute-value circuit 1343 are not essential circuits, but are added for making it easy for the comparator 1344 to detect presence or absence of the current.

The comparator 1344 binarizes the output signal (Iabs) of the absolute-value circuit 1343 (converts the output signal into pulses), and then outputs the result. At the timing of the falling edge of the output signal (Ipls) of the comparator 1344, the current flowing in the capacitor 132 vanishes. It should be noted that it is also possible to arrange that the state in which a little current flows is detected instead of the state in which no current flows at all. This configuration is adopted for preventing malfunction of the comparator 1344 due to noises when no current flows. If a lot of margin is taken here, the power generation efficiency is degraded due to the shift of the detection timing, and therefore, it is preferable to reduce the noise as much as possible, and perform the detection at the timing at which the current approximates 0.

In the switch control process shown in FIG. 13, after the step S100, whether or not the current value detected in the step S100 has made zero crossing is determined (step S102). In the present embodiment, the control section 140 performs the determination in the step S102 based on the output signal (Ipls) of the current detect circuit 134 of the current detection section 130.

If the current value of the current detected by the current detection section 130 makes the zero crossing (YES in the step S102), the control section 140 switches (step S104) the switch SW1 to the ON state. In the present embodiment, the control section 140 outputs a control signal to the switch SW1 to thereby switch the switch SW1 to the ON state.

After the step S104, the control section 140 starts (step S106) a timer. In the present embodiment, it is possible for the control section 140 to have the timer.

After the step S106, the control section 140 determines (step S108) whether or not the period (T/2) half as long as the resonance period T of the resonant circuit composed of the capacitance component Cg1 of the first piezoelectric device 108 and the inductor L1. In the present embodiment, the control section 140 performs the determination in the step S108. If the control section 140 determines (NO in the step S108) that the time T/2 has not elapsed, the step S108 is repeated.

If the control section 140 determines (YES in the step S108) that the time T/2 has elapsed, the control section 140 switches (step S110) the switch SW1 to the OFF state. In the present embodiment, the control section 140 outputs a control signal to the switch SW1 to thereby switch the switch SW1 to the OFF state. After the step S110, the control section 140 repeats the steps S100 through S110.

By switching between the ON/OFF states of the switch SW1 in such a manner as described hereinabove, the switch SW1 can be switched between the ON/OFF states at appropriate timings in accordance with the movement of the first piezoelectric device 108, and therefore, it becomes possible to efficiently generate the electrical power using the power generation unit 100.

Further, since the switch SW1 is switched between the ON/OFF states based on the current generated in the second piezoelectric device 110, the timing can be determined not based on whether or not the extreme value of the current value is reached but based on whether or not the current value traverses the reference value. Therefore, it is possible to accurately determine the timing at which the switch SW1 is switched. Thus, the power generation efficiency can be improved.

If the current value of the current detected in the current detection section 130 has not made the zero crossing (NO in the step S102), there is determined (step S112) whether or not the current detected by the current detection section 130 is one of equal to or higher than the first reference value Iref1 and equal to or lower than the second reference value Iref2. In the present embodiment, the control section 140 performs the determination in the step S112 based on the output signal (Ipls) of the current detect circuit 134 of the current detection section 130.

If the current value of the current detected by the current detection section 130 is one of equal to or higher than the first reference value Iref1 and equal to or lower than the second reference value Iref2 (YES in the step S112), the control section 140 switches (step S114) the switch SW1 to the ON state. In the present embodiment, the control section 140 outputs a control signal to the switch SW1 to thereby switch the switch SW1 to the ON state.

After the step S114, the control section 140 starts (step S116) a timer. In the present embodiment, it is possible for the control section 140 to have the timer.

After the step S116, the control section 140 determines (step S118) whether or not a predetermined period has elapsed. In the present embodiment, the control section 140 performs the determination in the step S118. Here, the predetermined period denotes the time for shorting the first electrode 108a and the second electrode 108b to thereby reduce the deformation of the first piezoelectric device 108. The length of the predetermined period is preferably the length of time with which the deformation of the first piezoelectric device 108 can sufficiently be reduced, such as a half of the vibration period of the laminate body of the first piezoelectric device 108 and the second piezoelectric device 110. If the control section 140 determines (NO in the step S118) that the predetermined period of time has not elapsed, the step S118 is repeated.

If the control section 140 determines (YES in the step S118) that the predetermined period of time has elapsed, the control section 140 switches (step S120) the switch SW1 to the OFF state. In the present embodiment, the control section 140 outputs a control signal to the switch SW1 to thereby switch the switch SW1 to the OFF state. After the step S120, or if the current value of the current detected by the current detection section 130 is neither one of equal to or higher than the first reference value Iref1 and equal to or lower than the second reference value Iref2 (NO in the step S112), the control section 140 and the current detection section 130 returns to the step S100 to repeat the series of processes described above.

By performing the processes of the steps S112 through S120 described above, it is possible to short the first electrode 108a and the second electrode 108b for a predetermined period of time to thereby prevent the first piezoelectric device 108 from deforming beyond an assumed range in the case in which the current value of the current generated in the second piezoelectric device 110 reaches the first reference value Iref1 or the second reference value Iref2 (i.e., the rate of deformation of the first piezoelectric device 108 reaches a level equal to or higher than a predetermined level). As a result, since the first piezoelectric device 108 and the second piezoelectric device 110 can be prevented from colliding with the members, which are disposed in the periphery of the first piezoelectric device 108 and the second piezoelectric device 110, and the housing, and it becomes unnecessary to dispose the buffer for absorbing the impact of the collision, it becomes possible to miniaturize the power generation unit 100.

Further, it becomes possible to efficiently generate the electrical power by controlling the timing for setting the single switch SW1 to the ON state (steps S100 through S110), and moreover, the deformation amount of the first piezoelectric device 108 can be reduced (steps S112 through S120). In other words, since the switch SW1 provided for efficiently generating the electrical power is also used for reducing the deformation amount of the first piezoelectric device 108, it becomes possible to inhibit the number of members constituting the power generation unit 100 from increasing.

B. First Modified Example

There exist a variety of modified examples in the present embodiment described above. Hereinafter, a first modified example will briefly be explained. It should be noted that the constituents substantially the same as those of the embodiment described above will be attached with the same reference symbols in each of the modified examples, and the detailed explanation therefor will be omitted.

Figure 15:
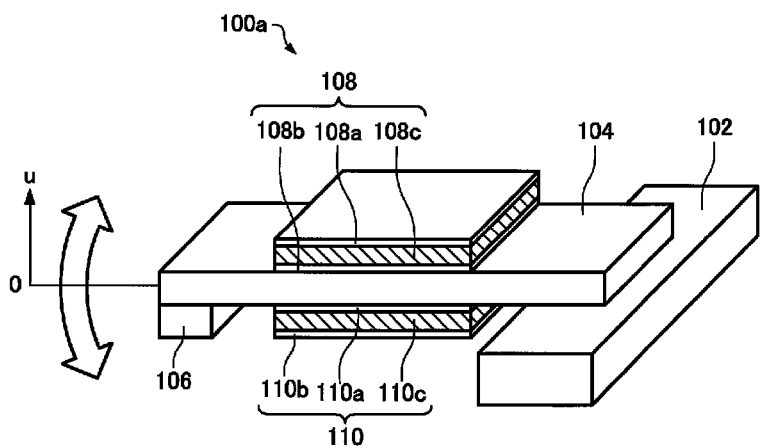
FIG. 15 is a diagram showing a structure of a power generation unit 100a according to a first modified example.

FIG. 15 is a diagram showing a structure of a power generation unit 100a according to a first modified example. The power generation unit 100a is further provided with a deforming member (a beam 104) deforming while switching the deformation direction, and the first piezoelectric device 108 and the second piezoelectric device 110 are stacked each other having the deforming member (the beam 104) sandwiched therebetween.

The mechanical structure of the power generation unit 100a according to the first modified example is formed as a cantilever structure in which the beam 104 having a mass 106 disposed at the tip thereof is fixed to a base 102 on the base end side thereof, and the beam 104 can deform while switching the deformation direction. Further, on the surfaces of the beam 104, there are disposed the first piezoelectric device 108 and the second piezoelectric device 110. In other words, the first piezoelectric device 108 and the second piezoelectric device 110 are stacked each other with the beam 104 sandwiched therebetween. Further, since the first piezoelectric device 108 and the second piezoelectric device 110 deform due to the deformation of the beam 104, the beam 104 corresponds to the "deforming member" according to the invention.

Since the beam 104 is fixed to the base 102 at the base end side thereof, and has the mass 106 disposed on the tip side thereof, when a vibration or the like is applied to the beam 104, the tip of the beam 104 vibrates with a large amplitude as indicated by the outlined arrow in the drawing. As a result, a compression force and a tensile force alternately act on the first piezoelectric device 108 and the second piezoelectric device 110 disposed on the respective surfaces of the beam 104. Then, the piezoelectric element 108c of the first piezoelectric device 108 generates positive and negative charges due to the piezoelectric effect, and the charges appear in the first electrode 108a and the second electrode 108b. Similarly, the piezoelectric element 110c of the second piezoelectric device 110 generates positive and negative charges due to the piezoelectric effect, and the charges appear in the first electrode 110a and the second electrode 110b. Further, although the mass 106 is not essential, it is desirable to create imbalance in mass between the tip side and the base end side of the beam 104. This is because the displacement of the beam 104 becomes easy to repeat in response to one vibration, for example, due to the imbalance in mass.

By stacking the first piezoelectric device 108 and the second piezoelectric device 110 with the deforming member (the beam 104) sandwiched therebetween as described above, the first piezoelectric device 108 and the second piezoelectric device 110 can easily be formed on both of the surfaces of the deforming member (the beam 104) using a manufacturing method such as a thin-film method.

C. Second Modified Example

Then, a second modified example will briefly be explained.

In the power generation unit 100 according to the embodiment described above, the explanation is presented assuming that there is provided the single piezoelectric device 108 for power generation and the single piezoelectric device 110 for control. However, it is not necessarily required to provide the single piezoelectric device 108 for power generation and the single piezoelectric device 110 for control, but a plurality of such devices can also be provided.

Figure 16A:
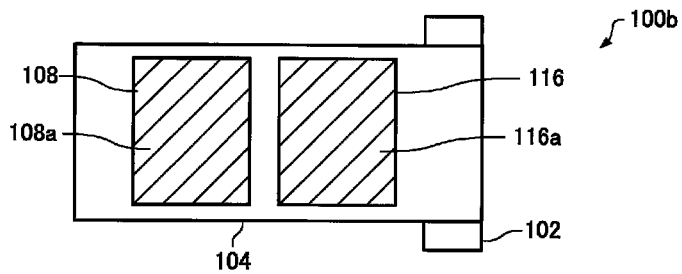
FIGS. 16A and 16B are explanatory diagrams showing an arrangement of piezoelectric devices of a power generation unit 100b according to a second modified example.
Figure 16B:
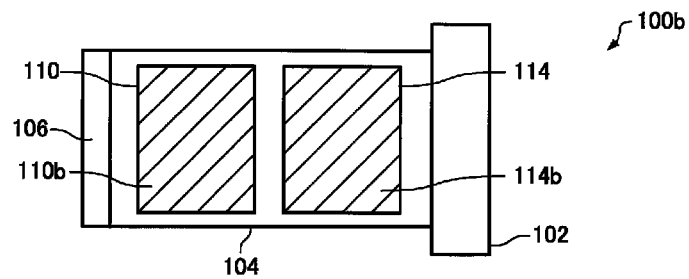

FIGS. 16A and 16B are explanatory diagrams showing a power generation unit 100b according to the second modified example provided with a plurality of piezoelectric devices for power generation and a plurality of piezoelectric devices for control. FIG. 16A is a plan view viewed from one surface of the beam 104. FIG. 16B is a plan view viewed from the other surface of the beam 104. FIG. 16A shows two piezoelectric devices (the piezoelectric device 108 and the piezoelectric device 116) for power generation disposed on the one surface of the beam 104, and FIG. 16B shows two piezoelectric devices (the piezoelectric device 110 and the piezoelectric device 114) for control disposed on the other surface of the beam 104. As shown in FIG. 16A, the piezoelectric devices 108, 116 for power generation are disposed on the one surface of the beam 104 so as to be arranged in the longitudinal direction of the beam 104. Further, as is obvious from the comparison between FIGS. 16A and 16B, the piezoelectric device 110 for control is disposed at the position opposed to the piezoelectric device 108 for power generation across the beam 104, and the piezoelectric device 114 for control is disposed at the position opposed to the piezoelectric device 116 for power generation across the beam 104. Similarly to the piezoelectric device 108, the piezoelectric device 116 is configured including a piezoelectric element 116c formed of a piezoelectric material such as lead zirconium titanate (PZT), and a pair of electrodes each formed of a metal thin film on the surface of the piezoelectric element 116c, namely a first electrode (an upper electrode) 116a and a second electrode (a lower electrode) 116b. The first electrode (the upper electrode) 116a and the second electrode (the lower electrode) 116b are disposed so as to be opposed to each other across the piezoelectric element 116c. Similarly to the piezoelectric device 110, the piezoelectric device 114 is configured including a piezoelectric element 114c formed of a piezoelectric material such as lead zirconium titanate (PZT), and a pair of electrodes each formed of a metal thin film on the surface of the piezoelectric element 114c, namely a first electrode (an upper electrode) 114a and a second electrode (a lower electrode) 114b. The first electrode (the upper electrode) 114a and the second electrode (the lower electrode) 114b are disposed so as to be opposed to each other across the piezoelectric element 114c.

Figure 17:
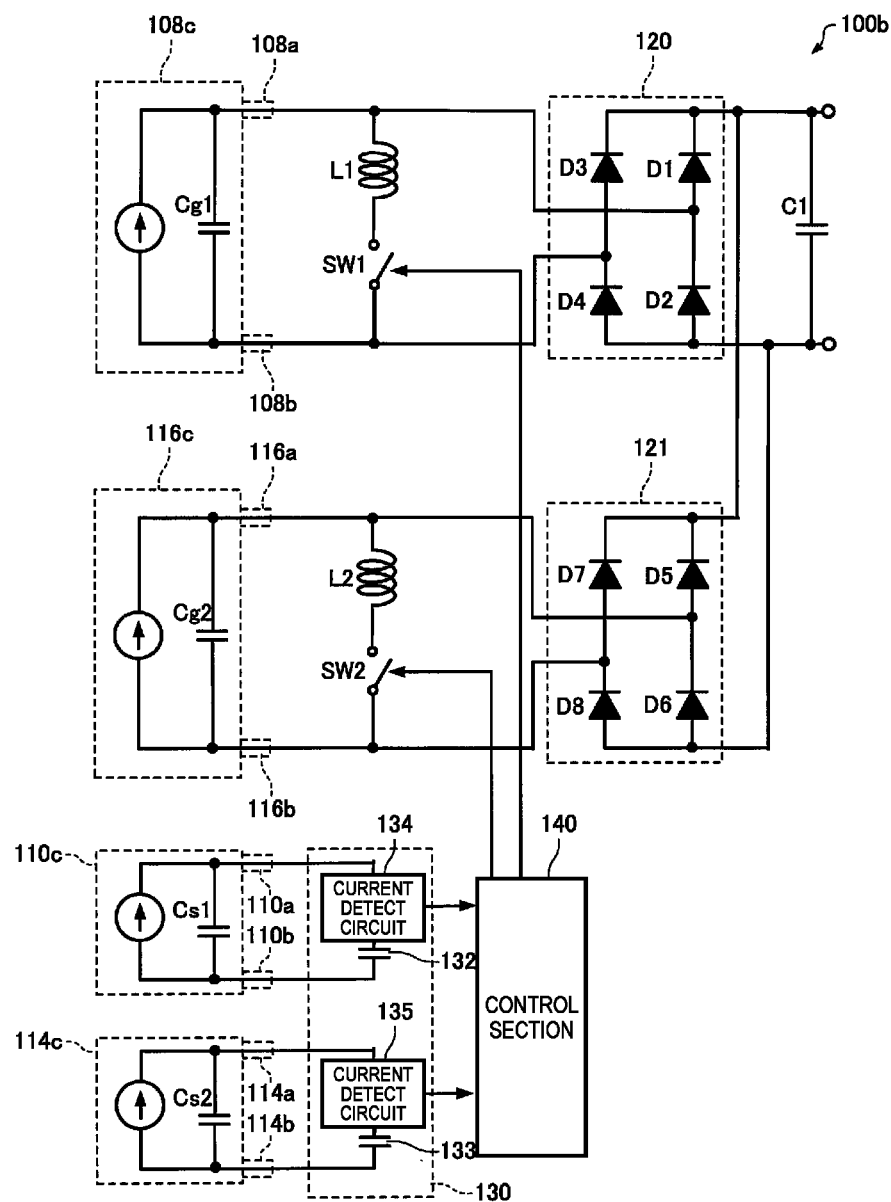
FIG. 17 is an explanatory diagram showing an electrical structure of the power generation unit 100b according to the second modified example.

FIG. 17 is an explanatory diagram showing an electrical structure of the power generation unit 100b according to the second modified example provided with the two piezoelectric devices 108, 116 for power generation, and the two piezoelectric devices 110, 114 for control. As is obvious from the comparison between FIGS. 17 and 1B, the power generation unit 100b according to the second modified example is obtained by adding the piezoelectric element 116 for power generation, an inductor L2, a switch SW2, a rectifier 121 composed of four diodes D5 through D8, the piezoelectric device 114 for control, and so on to the embodiment described above. These constituents thus added function similarly to the piezoelectric element 108 for power generation, the inductor L1, the switch SW1, the rectifier 120, the piezoelectric device 110 for control, and so on explained in the embodiment described above. Further, the current detection section 130 detects the current generated in the piezoelectric device 110 and the current generated in the piezoelectric device 114. In the example shown in FIG. 17, the current detection section 130 is configured including a capacitor 133 connected in parallel to the piezoelectric device 114, and a current detect circuit 135 for detecting the current flowing in the capacitor 133.

By setting the switch SW1 to the ON state until the predetermined time (e.g., the time half as long as the resonance period T) has elapsed from when the current value of the current generated in the piezoelectric device 110 for control makes the zero crossing, the charges generated in the piezoelectric device 108 for power generation are efficiently stored in the capacitor C1. Similarly, by setting the switch SW2 to the ON state until the predetermined time (e.g., the time half as long as the resonance period T) has elapsed from when the current value of the current generated in the piezoelectric device 114 for control makes the zero crossing, the charges generated in the piezoelectric device 116 for power generation are also stored in the capacitor C1.

Further, similarly to the case in which the deformation of the piezoelectric device 108 for power generation is reduced by setting the switch SW1 to the ON state until the predetermined time has elapsed from when there occurs at least either one of the case in which the current value of the current generated in the piezoelectric device 110 for control reaches a level equal to or higher than the first reference value Iref1 or the case in which the current value reaches a level equal to or lower than the second reference value Iref2, the deformation of the piezoelectric device 116 for power generation is reduced by setting the switch SW2 to the ON state until the predetermined time has elapsed from when there occurs at least either one of the case in which the current value of the current generated in the piezoelectric device 114 for control reaches a level equal to or higher than a third reference value Iref3 or the case in which the current value reaches a level equal to or lower than a fourth reference value Iref4. By separately reducing the deformation of the piezoelectric devices 108, 116 for power generation, it is possible to separately reduce the deformation of the separate portions of the beam 104 respectively provided with the piezoelectric devices 108, 116 for power generation. As described above, since the deformation of the separate portions of the beam 104 is reduced separately, even if the excessive deformation occurs in one of the separate portions of the beam 104, the electrical power can be generated while reducing the deformation of only the one of the portions without reducing the deformation of the other of the portions. Therefore, it becomes possible to efficiently generate the electrical power while suppressing the excessive deformation in accordance with the diverse deformation of the beam 104.

D. Third Modified Example

Then, a third modified example will briefly be explained.

Figure 18:
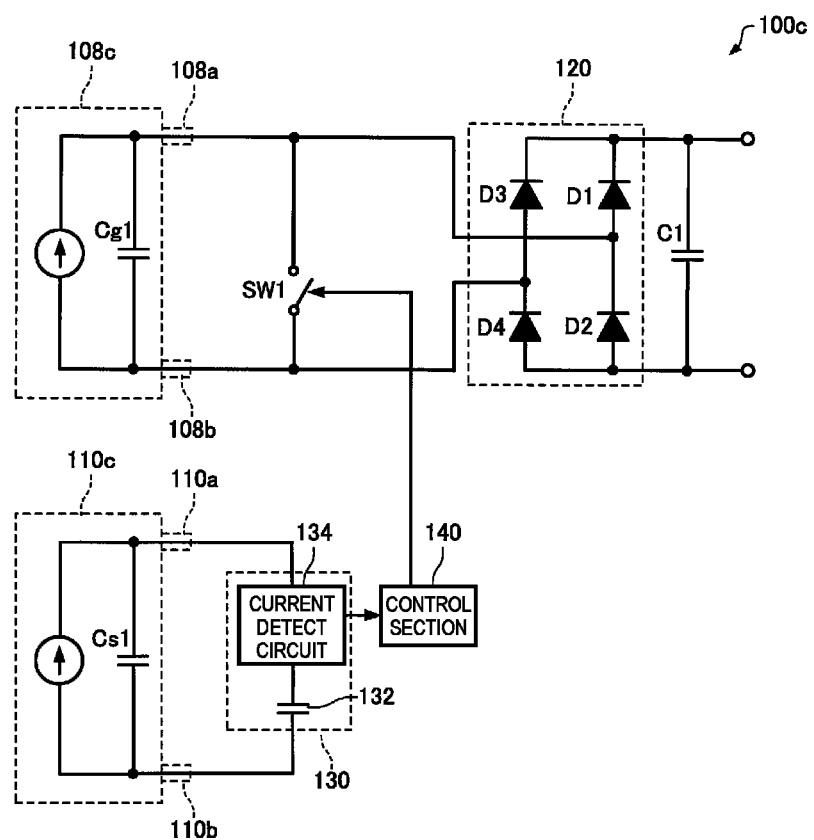
FIG. 18 is an explanatory diagram showing an electrical structure of a power generation unit 100c according to a third modified example.

FIG. 18 is an explanatory diagram showing an electrical structure of a power generation unit 100c according to the third modified example. As is obvious from the comparison between FIGS. 18 and 1B, the power generation unit 100c according to the third modified example is obtained by eliminating the inductor L1 from the embodiment described above. In other words, such an LC resonant circuit as in the embodiment described above is not formed in the power generation unit 100c according to the third modified example. Thus, the control process (steps S102 through S110 in FIG. 13) for using the LC resonant circuit and performed by the control section 140 can be eliminated.

Obviously, since the power generation unit 100c according to the third modified example does not use the LC resonant circuit unlike the power generation unit 100 according to the embodiment described above, such an efficient charge accumulation as in the power generation unit 100 according to the embodiment cannot be expected. However, by performing the process (steps S112 through S120 in FIG. 13) of setting the switch SW1 to the ON state when the deformation amount reaches a level equal to or higher than the predetermined value, the deformation of the first piezoelectric device 108 can be reduced. As described above, the power generation unit 100c according to the third modified example can prevent the first piezoelectric device 108 and the second piezoelectric device 110 from colliding with the members, which are disposed in the periphery of the first piezoelectric device 108 and the second piezoelectric device 110, and the housing while suppressing the growth in the number of components (the inductor L1) and the processing load (the control process for using the LC resonant circuit).

E. Electronic Apparatus, Transportation Device, and Battery

Figure 19:
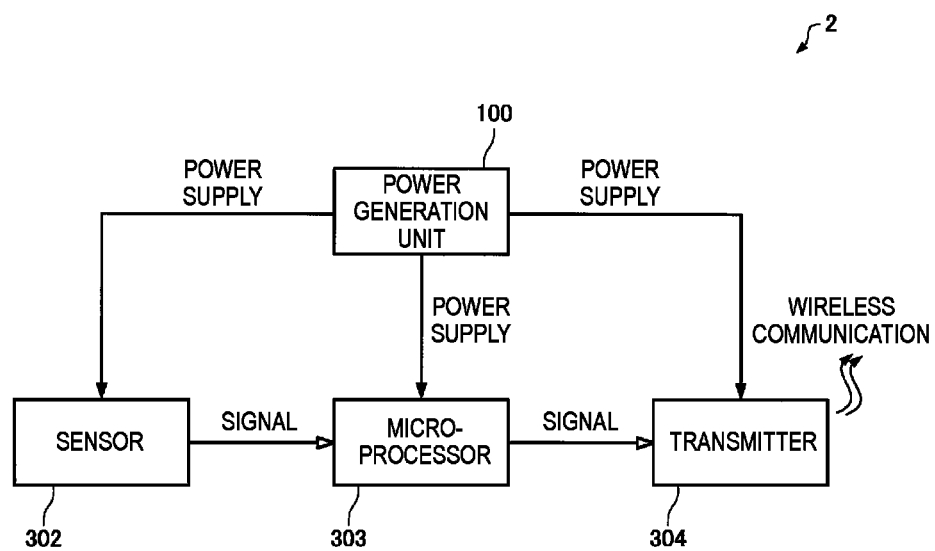
FIG. 19 is a diagram showing an electrical structure of an example of an electronic apparatus 2 equipped with the power generation unit 100.

FIG. 19 is a diagram showing an electrical structure of an example of an electronic apparatus 2 equipped with the power generation unit 100. The electronic apparatus 2 is used as a sensor node for structure health monitoring for determining the health of a structure. The electronic apparatus 2 is configured including a sensor 302, a microprocessor 303 for collecting data output by the sensor 302, and a transmitter 304 for wirelessly transmitting the data thus collected by the microprocessor 303. As the sensor 302, an acceleration sensor is used for monitoring the vibration of the structure. The power generation unit 100 supplies the sensor 302, the microprocessor 303, and the transmitter 304 with the electricity.

Since the electronic apparatus 2 shown in FIG. 19 is used in a condition of being embedded in concrete of the structure, the maintenance such as battery change or charging is extremely difficult. However, the electronic apparatus 2 is provided with the power generation unit 100 capable of generating the electrical power using the vibration of the structure, and can therefore operate almost permanently without requiring the maintenance.

It should be noted that it is also possible for the electronic apparatus 2 to be provided with either one of the power generation units 100a, 100b, and 100c instead of the power generation unit 100. Also in this case, the same advantages can be obtained.

Further, since the power generation unit according to the invention generates power in accordance with the vibration or the transportation, by installing the power generation unit on a bridge, a building, or a possible landslide place, it is also possible to generate electrical power at the time of disaster such as an earthquake, and to supply the electricity to a network device such as an electronic apparatus at only the time of need (disaster).

It should be noted that the power generation unit according to the invention can be miniaturized, and can therefore be installed in every apparatus. For example, by applying the power generation unit according to the invention to a transportation device (transportation equipment) such as a vehicle, a bicycle, an electric train, or a plane, it is also possible to generate electrical power by the vibration due to the transportation, and to supply the electrical power efficiently to the equipment provided to the transportation device.

In this case, in order to cope with all of the vibrations, it is also possible to incorporate a plurality of power generation units 100 different in length of the beam 104 and weight of the mass 106 in the transportation device. For example, it is also possible to constitute a power generating unit having the plurality of power generation units 100 fixed to the base 102 common to the power generation units 100.

Further, it is also possible to incorporate the power generation unit according to the invention in a small-sized electronic apparatus such as a remote controller instead of the battery or as an aid to the battery.

Further, the power generation unit according to the invention can be configured as a battery having the same shape as, for example, a button battery or a dry-cell battery, and can also be used in general electronic apparatuses instead of being installed in a specific electronic apparatus or the like. In this case, since it is possible to charge the capacitor by a vibration, the power generation unit can be used as a battery even in the time of disaster with electricity lost. Further, since the life thereof is longer than that of a primary cell, reduction of environmental load can be achieved in terms of a life cycle.

Although the embodiment and the modified examples are explained hereinabove, the invention is not limited to the embodiment and the modified examples described above, but can be put into practice in various forms within the scope or the spirit of the invention.

For example, in the first modified example described above, the explanation is presented assuming that the first piezoelectric device 108 and the second piezoelectric device 110 are attached to the beam 104 having the cantilever structure. However, the first piezoelectric device 108 and the second piezoelectric device 110 can be attached to any member providing the member is easily deformed in a repeated manner due to a vibration or the like. For example, it is also possible to attach the first piezoelectric device 108 and the second piezoelectric device 110 to surfaces of a thin film, or it is also possible to attach the first piezoelectric device 108 and the second piezoelectric device 110 to side surfaces of a coil spring.

The invention includes configurations (e.g., configurations having the same function, the same way, and the same result, or configurations having the same object and the same advantages) substantially the same as those described in the embodiment section. Further, the invention includes configurations obtained by replacing non-essential parts of the configurations described in the embodiment section. Further, the invention includes configurations providing the same functions and the same advantages or configurations capable of achieving the same object as those of the configurations described in the embodiment section. Further, the invention includes configurations obtained by adding technologies known to the public to the configurations described in the embodiment section.

This application claims priority to Japanese Patent Application No. 2011-219334, filed on Oct. 3, 2011, and Application No. 2012-144446, filed on Jun. 27, 2012, the entirety of which is hereby incorporated by reference.

What is claimed is:

1. A power generation unit comprising:
a first piezoelectric device having a pair of electrodes;
a second piezoelectric device stacked on the first piezoelectric device;
a switch electrically connected between the pair of electrodes;
a current detection section adapted to detect a current generated in the second piezoelectric device; and
a control section adapted to control the switch,
wherein the control section electrically connects the switch for a predetermined period in at least either one of a case in which the current detected by the current detection section reaches a level one of equal to and higher than a first reference value or a case in which the current reaches a level one of equal to and lower than a second reference value.

2. The power generation unit according to claim 1, further comprising:
an inductor connected in series to the switch,
wherein the inductor and the first piezoelectric device constitute a resonant circuit, and
in a period other than the predetermined period, the control section electrically connects the switch at a timing at which a deformation direction of the first piezoelectric device is switched, and then the control section electrically disconnects the switch at a timing at which a predetermined time has elapsed.

3. The power generation unit according to claim 2, wherein the control section electrically connects the switch at a timing at which the deformation direction of the first piezoelectric device is switched based on the current detected by the current detection section.

4. The power generation unit according to claim 1, wherein the current detection section includes
a capacitor connected in parallel to the second piezoelectric device, and
a current detect circuit adapted to detect a current flowing in the capacitor.

5. The power generation unit according to claim 1, further comprising:
a deforming member adapted to deform while switching a deformation direction,
wherein the first piezoelectric device and the second piezoelectric device are laminated sandwiching the deforming member.

6. An electronic apparatus comprising:
the power generation unit according to claim 1.

7. An electronic apparatus comprising:
the power generation unit according to claim 2.

8. An electronic apparatus comprising:
the power generation unit according to claim 3.

9. An electronic apparatus comprising:
the power generation unit according to claim 4.

10. A transportation device comprising:
the power generation unit according to claim 1.

11. A transportation device comprising:
the power generation unit according to claim 2.

12. A transportation device comprising:
the power generation unit according to claim 3.

13. A transportation device comprising:
the power generation unit according to claim 4.

14. A battery comprising:
the power generation unit according to claim 1.

15. A battery comprising:
the power generation unit according to claim 2.

16. A battery comprising:
the power generation unit according to claim 3.

17. A battery comprising:
the power generation unit according to claim 4.

18. A method of controlling a power generation unit, comprising:
providing a first piezoelectric device having a pair of electrodes, a second piezoelectric device stacked on the first piezoelectric device, and a switch electrically connected between the pair of electrodes;
detecting a current generated in the second piezoelectric device; and
connecting electrically the switch for a predetermined period in at least either one of a case in which the current detected in the detecting reaches a level one of equal to and higher than a first reference value or a case in which the current reaches a level one of equal to and lower than a second reference value.

* * * * *